United States Patent
Enda

(10) Patent No.: US 6,304,834 B1
(45) Date of Patent: Oct. 16, 2001

(54) METHOD AND APPARATUS FOR SEMICONDUCTOR DEVICE SIMULATION WITH LINERLY CHANGING QUASI-FERMI POTENTIAL, MEDIUM STORING PROGRAM FOR THE SIMULATION, AND MANUFACTURING METHOD FOR THE SEMICONDUCTOR DEVICE

(75) Inventor: Toshiyuki Enda, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/395,963

(22) Filed: Sep. 14, 1999

(30) Foreign Application Priority Data

Sep. 25, 1998 (JP) .................................. 10-272180

(51) Int. Cl.[7] .............................. G06G 7/48; G06G 7/56; G06G 7/62; G06F 17/50
(52) U.S. Cl. ..................................... 703/4; 703/5; 703/13
(58) Field of Search .......................... 703/14, 2–3, 4–15, 703/13

(56) References Cited

U.S. PATENT DOCUMENTS

| | | | |
|---|---|---|---|
| 5,103,415 | * | 4/1992 | Omura et al. ........................... 716/20 |
| 5,289,384 | * | 2/1994 | Akiyama ................................. 703/13 |
| 5,684,723 | * | 11/1997 | Nakadai ................................. 716/20 |
| 5,889,687 | * | 3/1999 | Enda ....................................... 703/4 |

OTHER PUBLICATIONS

Shigyo et al.; "Discretization problem for multidimensional current flow"; IEEE Trans. CAD IC; pp. 1046–1050, Oct. 1989.*

Selberherr; "Analysis and Simulation of Semiconductor Devices"; Springer–Verlag, Wien New York; vol. 6, No. 3; 1984; pp. 1–292.

Selberherr; "Analysis and Simulation of Semiconductor Devices"; Springer–Verlag, Wien New York; "Finite Elements"; vol. 6, No. 3; 1984; pp. 181–191.

Yie et al.; "Nonocsillatory Streamline Upwind Formulations for Drift–Diffusion Equation"; IEEE Transactions of Computers–Aided Design of Integrated Circuits and Systems; vol. 12, No. 10; Oct. 1993; pp. 1535–1541.

Scharfetter et al.; "Large–Signal Analysis of A Silicon Read Diode Oscillator"; IEEE transactions on Electron Devices; vol. ED–16, No. 1; Jan. 1969; pp. 64–77.

* cited by examiner

*Primary Examiner*—Kevin J. Teska
*Assistant Examiner*—Hugh Jones
(74) *Attorney, Agent, or Firm*—Foley & Lardner

(57) ABSTRACT

A semiconductor device simulator having a grid generator, a quasi-Fermi potential setting unit, a bias setting unit, a coefficient matrix and residual vector setting unit and a matrix calculator is disclosed. A grid generator defines a finite number of grid points inside and around a semiconductor device, and generates a plurality of grids. A quasi-Fermi potential setting unit sets said linear quasi-Fermi potentials, which is linearly changing, at each section inside the generated grid. A bias setting unit defines the terminal bias to be applied to predetermined electrode regions. A coefficient matrix and residual vector setting unit obtains carrier concentration inside each grid from the quasi-Fermi potential, and sets coefficient matrix/residual vector for the basic equations. A matrix calculator calculates this coefficient matrix, and accordingly obtains the solution for the Poisson's equation and the carrier continuity equations to obtain the device behavior. Furthermore, the device simulation method, the recording medium storing the program for causing the device simulator to function, and the manufacturing method for the semiconductor device using them are also disclosed.

11 Claims, 11 Drawing Sheets

$\theta$

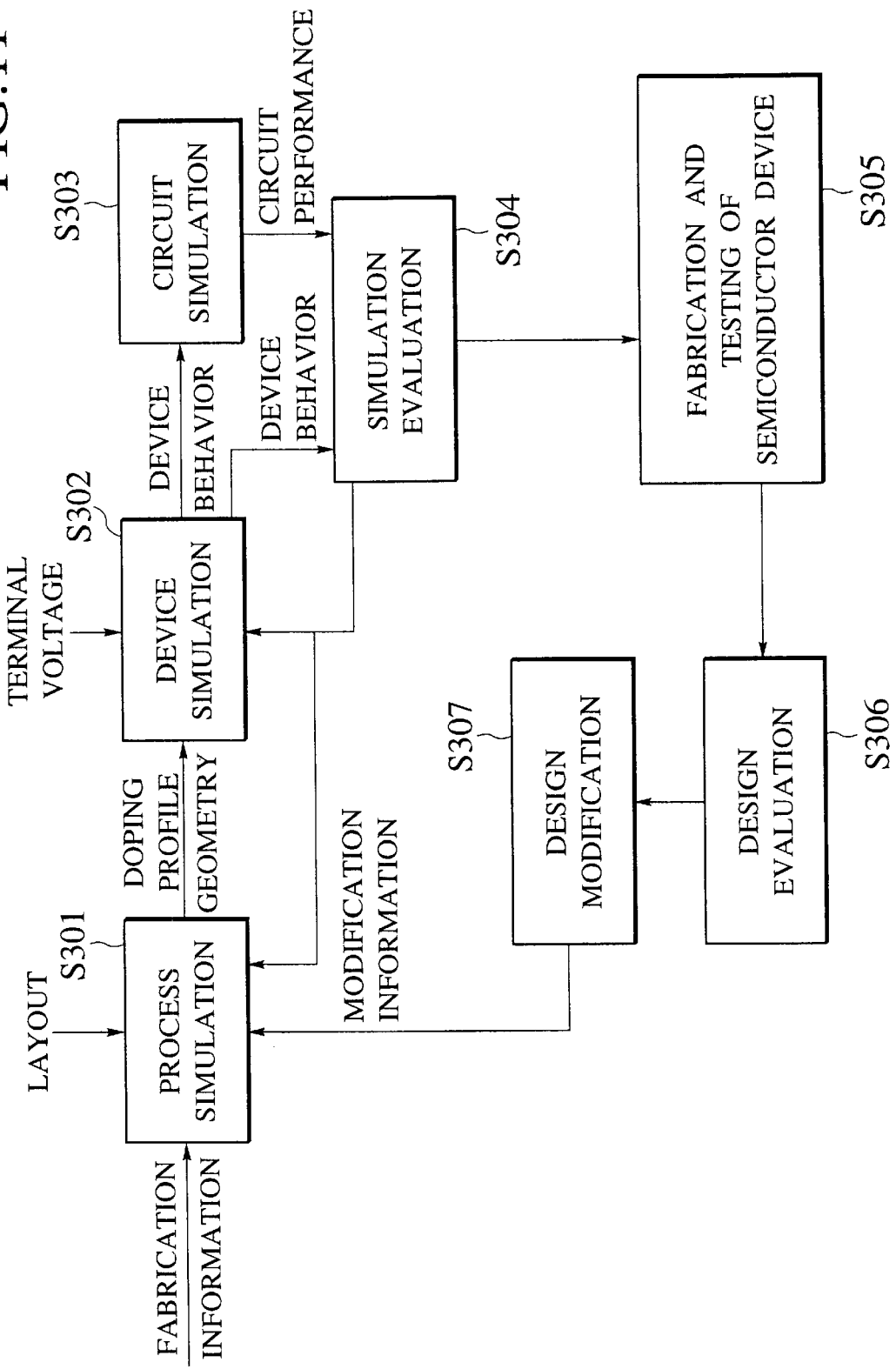

METHOD AND APPARATUS FOR SEMICONDUCTOR DEVICE SIMULATION WITH LINERLY CHANGING QUASI-FERMI POTENTIAL, MEDIUM STORING PROGRAM FOR THE SIMULATION, AND MANUFACTURING METHOD FOR THE SEMICONDUCTOR DEVICE

BACKGROUND OF THE INVENTION

1. Field of the Invention

The present invention relates to a simulation technique for various semiconductor devices, such as integrated circuits (LSIs, VLSIs, ULSIs or GSIs), high frequency transistors, power semiconductor devices, light emitters, photodetectors, and the like, and a manufacturing method using it. More particularly, the present invention relates to a device simulation method, an apparatus for the device simulation (a device simulator), a physically readable recording medium on which a device simulation program is stored, and a manufacturing method for the semiconductor device using them.

2. Description of the Related Art

In the manufacturing of a complex advanced semiconductor device, it is not desirable to test the behaviors of the semiconductor devices, after fabricating actual samples and measuring the characteristics of the actual devices, since there may be a fear of waste of enormous time and cost. For this reason, the following methodology is being preferably employed, in these days. That is, before starting the fabrication process of the semiconductor devices such as LSIs, which may have very small feature sizes, the highly integrated structures or the highly packed structures, the physical or electrical characteristics of the semiconductor devices scheduled to be manufactured are simulated on the basis of numerical calculation by a computer system. In the numerical calculation, the geometrical structures, physical principles or the boundary conditions are supposed to be substantially similar to those of the actual semiconductor device. Then, the evaluations are performed on the simulated results of the semiconductor device to thereby check the virtual device behaviors. And finally, the actual manufacturing process is executed, if the affirmative results are obtained.

However, if some calculation errors are included in the result of the simulation, a problem is naturally brought about in the semiconductor device manufacturing process based upon it. For example, if the failures are observed in the characteristics and the like after the completion of the prototype through a long complex fabrication process needing several weeks or more, the design must be again reviewed, and the long complex fabrication process must be again repeated, which causes a waste of time and a running cost to be uselessly spent. In this way, the improvement of the accuracy of the simulation is very important since it directly contributes to the reduction of a manufacturing period of the semiconductor device. Originally, it is impossible to recover a time lost by failure of the design. Especially, the speed of the developments of the semiconductor device having higher performances are competed among many manufacturing firms in the semiconductor industry. So, the reduction of the period from the design stage to the product stage is extremely important.

In a device simulation to obtain the device behavior of the semiconductor device, input data such as the geometrical structures, the impurity profiles, terminal voltages and the like are prepared at first, and are then input to the device simulator. Then, the device simulator obtains the solutions of the Poisson's equation, the electron current continuity equation and the hole current continuity equation which are "the basic equations" for prescribing the electrical characteristics of the semiconductor devices by numerical calculation. As a result, the device simulator outputs the device behaviors of the semiconductor device.

The basic equations required to obtain the electrical characteristics of the semiconductor device are simultaneous differential equations of the potential distribution and the carrier concentration (actually, the electron concentration n and the hole concentration p), as represented by the following equations (1) to (3):

$$\nabla \cdot D = q(p - n + N_D - N_A) \tag{1}$$

$$\partial(-qn)/\partial t + \nabla \cdot J_e = -qU \tag{2}$$

$$\partial(qp)/\partial t + \nabla \cdot J_n = qU \tag{3}$$

Here, D is the electric displacement vector, q is the absolute electron charge, $N_D$ is the donor concentration, $N_A$ is the acceptor concentration, t is the time, $J_e$ is the electron current density vector, $J_n$ is the hole current density vector, and U is the net carrier generation-recombination rate. Moreover, a potential ψ, a electron concentration n and a hole concentration p at each point of the semiconductor device are arbitrarily given to the basic equations as "the initial guess". Then, modification is added until those values satisfy the above-mentioned basic equations, and the solutions are obtained by using the computer system and the like. However, in order to solve the basic equations (1) to (3) by using the computer system, it is necessary to carry out "the discretization" of the carrier current density vector.

As shown in FIG. 1, in the device simulation, a finite number of grid points (mesh points) are firstly defined inside and around the semiconductor device targeted by the simulation (referred to as an analysis area). In a case of a two-dimensional space, polygons with each grid point at the vertex are defined (in a case of a three-dimensional space, polyhedrons with each grid point as the vertex are defined). This polygon is referred to as "the grid". These polygons or polyhedrons cover the analysis area without gap and overlap. Physical parameters are defined associated with the grid points, as necessary. Also, the space within the polygon or the polyhedron, which contains a grid point therein, is referred to as "the control volume". Namely, each control volume is associated with each grid point. The control volumes also cover the analysis area without gap and overlap. The discretization implies a technique of calculating carrier current density vector flowing out from (or flowing into) the control volume on the basis of the physical parameter at the grid point.

Two prior art techniques are well known with regard to this discretization of the carrier current density vector. One is a technique disclosed in "*Analysis and Simulation of Semiconductor devices*" by Siegfried Selberherr, Springer-Verlag, Wien N.Y., 1984, 6.3 "*Finite Elements*", pp.181–191. Hereafter, this technique is referred to as "the first prior art". The first prior art employs the Scharfetter-Gummel scheme (usually referred to as "the S-G scheme"), known as a method for calculating the carrier current density flowing on a one-dimensional line. The first prior art applies the S-G scheme to a grid system of a triangle or a quadrangle located on a two-dimensional plane. That is, the first prior art calculates the carrier current density flowing on each line (a side of the triangle or the quadrangle) in the grid system by using the S-G scheme, under the assumption that the carrier current flows only on each line in the grid system. This two-dimensional grid system is similar to a circuit in which conductive lines are linked in the same configuration. The first prior art calculates the current flowing on a conductive line linked between nodes in this circuit. This calculation is as follows.

At first, a current $^{Sel}I_{0,1}$ flowing out from the control volume corresponding to a grid point I is given by the following equation. Here, definitions of symbols as shown in FIGS. 2 and 3 are used:

$$^{Sel}I_{O,I} = \sum_{j=0}^{N_1} {}^{SG}I_{IJ} \qquad (4)$$

And $^{SG}I_{0,1}$ is the current flowing on a side IJ having a grid point I and a grid point J, from point I to point J. It is defined by the following equation:

$$^{SG}I_{0,1}=(d_{IJ}\cdot D_{IJ/IIJ})(B_{IJ}C_I - B^*_{IJ}C_J) \qquad (5)$$

$$B_{IJ}=B(Q\psi_{IJ}/kT) \qquad (6)$$

$$B^*_{IJ}=B(-Q\psi_{IJ}/kT) \qquad (7)$$

Here, k is the Boltzmann's constant, T is the temperature, $C_I$ and $C_J$ are carrier concentrations at respective grid points I, J. $\psi_{IJ}$ is the potential difference ($\psi_{IJ}=\psi_I-\psi_J$) in the respective grid points I, J. $d_{IJ}$ is the distance between the sides IJ and the center of the circumcircle of the triangular grid. $D_{IJ}$ is the diffusion coefficient from point I to point J. And, $l_{IJ}$ is the distance between the grid points I and J. Also, Q is the charge of the carrier. It is –q in a case of electron, and it is +q in a case of hole.

In the first prior art, the current is calculated by using the S-G scheme, under the assumption that it flows on the sides linked between the grid points. However, these sides are virtually defined in order to carry out the simulation. In the actual semiconductor device, the current flows through any point of a semiconductor region constituting the semiconductor device. A problem of the first prior art is caused by a difference between this simulation and the situation of the actual current flow. This implies a problem that a calculation error is brought about depending on a manner of defining the grid point. This calculation error is referred to as "the spurious crosswind diffusion". The occurrence of the spurious crosswind diffusion causes the result of the simulation to be inaccurate. Thus, the spurious crosswind diffusion is an important problem.

The problem of the spurious crosswind diffusion is pointed out by many researchers. For example, it is noted in "Nonosillatory Streamline Upwind Formulations for Drift-Diffusion Equation" by He Yie and Teng Zhimeng, *IEEE Transactions on Computer-Aided Design of Integrated Circuits and Systems*, Vol. 12, No.10, pp.1535–1541, 1993 (hereafter, the technique disclosed in this document is referred to as "the second prior art"). The object of the second prior art is to suppress the spurious crosswind diffusion occurring in the first prior art. In the second prior art, it is assumed that carrier current flows not only on a line of a grid but also in any direction. The carrier current is typically given by a sum of the diffusion term and the convection term. Then, in the second prior art, a virtual line different from the grid is considered in a direction of the convection current as shown in FIG. 4. In FIG. 4, the oblique dotted line is the virtual line referred as "the streamline". And the current density is calculated by using the S-G scheme with regard to the streamline along the drift velocity vector "v". However, in order to use the S-G scheme, it is necessary to know carrier concentrations at both ends of a the line. So, the carrier concentrations at both ends of the streamline are obtained by interpolation from the carrier concentration at the actual grid point. In this way, the carrier current density calculated by the S-G scheme is assumed to be the term in the direction of the streamline of carrier current density vector on a two-dimensional plane. Besides this term, in the second prior art, it is assumed that the diffusion current proportional to the concentration gradient flows in the direction perpendicular to the streamline. Then, the vector sum of these two terms becomes the carrier current density vector calculated by the second prior art.

Actually, in the second prior art, the carrier concentration is interpolated as shown in FIG. 4, in order to suppress the spurious crosswind diffusion. A current density vector at a grid point (i,j) is not calculated on the basis of only the carrier densities at the peripheral grid points as in the first prior art. The carrier current density vector is calculated from carrier concentration $n_{U}$ on an upstream side of the streamline passing through the grid point (i,j). As shown in FIG. 4, carrier concentration $n_{U}$ is the variable value at the crosspoint of the streamline and cell boundary line at the upstream side, which can be obtained from an appropriate interpolation of original carrier concentrations at peripheral grid points (i–1,j) and (i–1,j–1). That is, the carrier current density vector is calculated from the carrier concentrations at the three grid points.

However, the spurious crosswind diffusion can not be canceled even by the second prior art. FIG. 5, which is cited from the second prior art, is a view showing numerical errors in the first and second prior arts. It is understood that the spurious crosswind diffusion is incurred even in the second prior art.

The problem when the S-G scheme—the scheme calculates the carrier current density flowing on the one-dimensional line—is applied to the two or three dimensional device simulation is that the calculated device characteristic and the convergence of the device simulation depend on the way for defining the grid. The grid generated in the device simulation does not exist in the actual semiconductor device, and it is used for convenience of the calculation. Ideally, it is desirable as the device simulation that the calculation result can be obtained independently of the method for defining the grid.

This dependency of the carrier current density vector on the method for defining the grid is caused by the fact that the S-G scheme can calculate only the current density vector on the one-dimensional side. In order to execute the device simulation in which the current distributes in the two or three dimensional space by using the S-G scheme, it is supposed that the current flows only on the side of the grid (in the first prior art). Or, the streamline different from the grid is assumed and the carrier current density vector is interpolated from the carrier concentration at the actual grid point (in the second prior art). Then, with regard to this streamline, the current density is calculated by using the S-G scheme. However, this supposition results in a problem that the calculated device characteristic and the convergence of the device simulation strongly depend on the method for setting the grid.

As mentioned above, the first and second prior arts can not provide the carrier current density vector at any point inside the grid. For this reason, the carrier current continuity equations are approximately solved on the basis of the carrier current density vector flowing on the line of the grid. Thus, the problem of the spurious crosswind diffusion is brought about, and the solutions of the basic equations can not be accurately calculated. Hence, the device behavior are inaccurately simulated.

SUMMARY OF THE INVENTION

The present invention is proposed in view of the above mentioned circumstances. It is therefore an object of the present invention to provide a simulation method which can accurately calculate the carrier current density vector at any point inside the grid, and further accurately obtain the solutions of the basic equations (1) to (3).

Another object of the present invention is to provide a simulation method, which can accurately calculate the divergence of the carrier current density at any point inside the grid and accurately obtain the solutions of the basic equations.

Still another object of the present invention is to provide a simulator, which accurately calculates the carrier current density vector and accurately obtains the solutions of the basic equations.

Still another object of the present invention is to provide a simulator, which accurately calculates the divergence of the carrier current density and accurately obtains the solutions of the basic equations.

Still another object of the present invention is to provide a recording medium storing a simulation program that can accurately calculate the carrier current density vector and accurately obtain the solutions of the basic equations.

Still another object of the present invention is to provide a recording medium storing a simulation program that can accurately calculate the divergence of the carrier current density and accurately obtains the solutions of the basic equations.

Still another object of the present invention is to provide a manufacturing method for a semiconductor device which can develop a semiconductor device having the desirable and advanced characteristics in a short time by speculating the characteristics of the semiconductor device before fabricating the actual devices.

In order to achieve the above-mentioned objects, the first feature of the present invention lies in a simulation method for obtaining the device behaviors of the semiconductor device. Namely, the simulation method comprising the steps of: defining a finite number of grid points inside and around a semiconductor device and then generating a plurality of grids; setting a quasi-Fermi potential of carrier; obtaining carrier concentration at any point inside each grid, from this quasi-Fermi potential; and using the respective carrier concentrations, solving the basic equations under predetermined boundary conditions. The quasi-Fermi potential changes linearly at each section inside the grid. The basic equations comprise the Poisson's equation and the carrier continuity equations, represented by Eqs. (1) to (3). Here, the carrier implies electron and hole, and the quasi-Fermi potential of the carrier implies the quasi-Fermi potential $\phi_n$ of electron and the quasi-Fermi potential $\phi_p$ of hole.

The simulation method according to the first feature of the present invention can accurately calculate the carrier current density vector at any point inside the generated grid. Thus, this method can accurately obtain the solutions of the basic equations for the device simulation. That is, the simulation method according to the first feature of the present invention can accurately simulate the necessary device behaviors of the semiconductor device.

In the first feature of the present invention, it is assumed that the carrier in the semiconductor region constituting the semiconductor device obeys the Brownian motion at the thermal velocity $V_{th}$, and then a time scale of scattering is given by the momentum relaxation time $\tau_p$. And micro areas (grids) are defined within the semiconductor region. Then, it is assumed that the gradients of the quasi-Fermi potentials $\nabla \phi_n$, $\nabla \phi_p$ and the electric field E are constants within the micro areas (grids). It is also assumed that the carrier concentration obeys the Boltzmann statistic.

Thus, by using the quasi-Fermi potential $\phi_p$ of hole and the quasi-Fermi potential $\phi_n$ of electron, the hole concentration p and the electron concentration n are given by the following equations (8), (9):

$$p = n_i \exp(-q(\psi - \phi_p)/kT) \qquad (8)$$

$$n = n_i \exp(q(\psi - \phi_n)/kT) \qquad (9)$$

In order to solve the basic equations (1) to (3) under the predetermined boundary conditions, it is desirable to assume that the donor concentration $N_D$, the acceptor concentration $N_A$ and the carrier generation-recombination rate U are monotonically changing in the generated grids. That is the donor concentration $N_D$, the acceptor concentration $N_A$ and the carrier generation-recombination rate U monotonically are assumed to be changing linearly or exponentially inside each grid.

Although the basic equations (1) to (3) are simultaneous partial differential equations, they must be converted into simultaneous equations, in order to solve by using a computer. Although the detailed calculation procedure is described later, it is desirable to convert the integral equations into the algebraic equations and use the carrier momentum relaxation time $\tau_p$, the carrier thermal velocity $V_{th}$ and the quasi-Fermi potential $\phi_r$ to then calculate carrier current density vector $J(r)$ at a position vector r by using the following equations:

$$J(r) = (V_{dv}(r) + V_{dp}(r))QC(r) \qquad (10)$$

$$V_{dv}(r) = (kT/Q\tau_p)\Lambda(r)^U \phi E_r/|^\phi E_r| \qquad (11)$$

$$V_{dp}(r) = V_{th}\xi(r)(^U E_r - (^U E_r \cdot ^U \phi E_r)^U \phi E_r) \qquad (12)$$

$\Lambda(r)$ in Eq. (11) is the coefficient for the drift velocity vector in the direction normal to carrier isopycnic surface, and it is represented by:

$$\Lambda(r) = 1 - |E_r/2|\sin h(\zeta_{r\phi})/(\eta_\phi \cdot \sin h(\zeta_r)) \qquad (13)$$

Here, $2\zeta_r$ is the potential at the carrier mean free path vector $\lambda$ normalized by the thermal potential (kT/q), and it is represented by:

$$2\zeta_r = Q|E_r||\lambda|/kT \qquad (14)$$

$\eta_\phi$ in Eq. (13) is given by the following equation:

$$\eta_\phi = |E_r/2 + \nabla \phi_r| \qquad (15)$$

$\zeta_{r\phi}$ in Eq. (13) is the potential corresponding to $\eta_\phi$ at the carrier mean free path vector $\lambda$ normalized by the thermal potential, and it is represented by:

$$\zeta_{r\phi} = Q\eta_\phi|\lambda|/kT \qquad (16)$$

On the other hand, $\xi(r)$ in Eq. (12) is the coefficient for the drift velocity in the direction parallel to the carrier isopycnic surface, and it is represented by:

$$\xi(r) = \cot h(\zeta_r) - 1/\zeta_r \qquad (17)$$

Moreover, $^\Phi E_r$ in Eq. (11) is the electric field vector at position vector r in which the quasi-Fermi potential $\phi_r$ is considered, and it is represented by:

$$^\Phi E_r = E + \nabla \phi_r \qquad (18)$$

Here, E is the electric field vector at the position vector r. $^U E_r$ is the unit electric field vector at the position vector r, and $^{U\Phi}E_r$ is the unit electric field vector in which the quasi-Fermi potential $\phi_r$ at the position vector r is considered. They are respectively represented as follows:

$$^U E_r = E_r/|E_r| \qquad (19)$$

$$^{U\Phi}E_r = ^\Phi E_r/|^\Phi E_r| \qquad (20)$$

Also, in the first feature of the present invention, the divergence $\nabla \cdot J(r)$ of the carrier current density vector J(r) at the potential vector r is given by:

$$\nabla \cdot J(r) = (Q/\tau_p) \Lambda(r) C(r) \qquad (21)$$

So, the device behavior may be obtained by using Eq. (21). As mentioned above, in the first feature of the present invention, it is assumed that the carriers in the semiconductor region constituting the semiconductor device are moving with the Brownian motion at the thermal velocity $V_{th}$. Under the Brownian motion at the thermal velocity $V_{th}$, carrier located at a point x at a time $t_0$ is located at a point separated by the mean free path $\lambda = V_{th} \cdot \tau_p$ at a time $t_1 = t_0 \tau_p$ after the time period of $\tau_p$. When the three-dimensional space is considered, if the electric field is 0, the carriers should be uniformly distributed on a spherical surface. However, since the electric field is not typically 0, the carriers are distributed unisotropically along the electric field direction. In the first feature of the present invention, the Boltzmann statistic is assumed. Thus, this unisotropic distribution is obtained as a function of the electric field E, the carrier temperature T, and the mean free path $\lambda$ which is the radius of the spherical surface. When the deviation of the carrier from $\tau_p$ is represented as the mean free path vector $\lambda$, a probability P ($\lambda$) per unit time unit solid angle in which the carrier is deviated in the direction of the mean free path vector $\lambda$ is given by the following equation:

$$P(\lambda) = 1/(4\pi\tau_p) \cdot \zeta_r \cdot \exp(\zeta_r)/\sin h\zeta_r \qquad (22)$$

If a micro area further smaller than the mean free path vector $\lambda$ is set around the point x, the carriers located within the same area at the time $t_0$ are all out of the area at a time $t_1$. Conversely, the carriers located within the same area at the time $t_1$ should be located on the spherical surface of the radius $\lambda$ around the point x at the original time $t_0$. The carrier concentration on the spherical surface is given by the following equation:

$$C(\lambda) = C(0) \exp(Q(E = \nabla \phi) \cdot \lambda/kT) \qquad (23)$$

A probability that carriers are located at the point x after $\tau_p$ is proportional to $P(-\lambda)$. Thus, when their products are integrated, the divergence of the current density is obtained as follows:

$$\nabla \cdot J = (Q/\tau_p) C(0) \Lambda(r) \qquad (24)$$

The current density vector J(r) in Eq. (10) is obtained by using Eq. (24).

The second feature of the present invention lies in a simulator which at least has a grid generator, a quasi-Fermi potential setting unit, a bias setting unit, a coefficient matrix and residual vector setting unit and a matrix calculator. Here, the grid generator defines a finite number of grid points inside and around a semiconductor device, and then generates a plurality of grids. The quasi-Fermi potential setting unit sets the quasi-Fermi potential, which is linearly changing, at each section inside the generated grid. The bias setting unit determines the biases applied to the predetermined electrode regions of the semiconductor device, such as a source electrode region, a drain electrode region, a gate electrode region and the like, on the basis of the device behavior to be simulated. The coefficient matrix and residual vector setting unit obtains the carrier concentration at any point inside each grid, and sets a coefficient matrix/residual vector for the basic equations. The matrix calculator obtains the solutions in accordance with a known Newton method. That is, the calculation is repeated, until the modification values obtained by solving the coefficient matrix are added to the solutions of the basic equations to accordingly modify the solutions, and thereby the solutions of the basic equations are converged. If the solutions are converged, the solutions are stored to the data memory as the solutions of the predetermined biases. In this way, with regard to each bias, the bias setting unit, the coefficient matrix and residual vector setting unit and the matrix calculator are used to solve the simultaneous equations converted from the Poisson's equation and the carrier continuity equations under the predetermined boundary condition to thereby obtain the device behavior with a small calculation error in a short time. The grid generator, the quasi-Fermi potential setting unit, the bias setting unit, the coefficient matrix and residual vector setting unit and the matrix calculator may have the dedicated circuits (hardwares) respectively, or may comprises a general purpose computer system in which the respective functions of the units are defined by the instructions given by a software program.

The simulator according to the second feature of the present invention can accurately calculate the carrier current density vector at any point inside the generated grid. Thus, this method can accurately obtain the solutions of the basic equations for the semiconductor device simulation represented by Eqs. (1) to (3). That is, the simulator according to the second feature of the present invention can accurately simulate the necessary device behaviors of the semiconductor device.

The program to attain the simulation method described in the first feature of the present invention is stored in a recording medium that can be read by the computer. Then, this recording medium is read by the computer system. Accordingly, the simulation method of the present invention can be executed. That is, the third feature of the present invention lies in the recording medium storing thereon the simulation program which at least comprises the steps of: defining a finite number of grid points inside and around a semiconductor device and then generating a plurality of grids; setting a quasi-Fermi potential of carrier, which is linearly changing, at each section inside this grid; obtaining carrier concentration at any point inside each grid, from this quasi-Fermi potential; and using the respective carrier concentrations to then solve the Poisson's equation and the carrier continuity equations under a predetermined boundary condition to thereby obtain the device behaviors of the semiconductor device. The third feature of the present invention can provide the recording medium storing thereon the program which can accurately simulate the device behavior. This reason is that this program can accurately calculate the carrier current density vector at any point inside the grid to accurately obtain the solutions of the basic equations of the semiconductor device simulation including the carrier current continuity equations. The "recording medium" implies the physically readable recording medium which can record thereon the program, and may include a semiconductor memory, a magnetic disk such as a flexible disk or a floppy disk, an optical disk such as a compact disk (CD)-ROM, a magneto-optical (MO) disk, and a magnetic tape such as a cassette tape, and an open reel tape.

The fourth feature of the present invention inheres in the manufacturing method for the semiconductor device. Namely the manufacturing method comprises the steps of obtaining device behavior by simulation; judging whether or not the device behaviors agree with the desired electrical specifications; and if it is judged the device behaviors agree with the desired electrical specifications, performing a series of fabrication processes to attain the semiconductor device. The series of fabrication processes includes the impurity doping and the geometry processing. Further, the simulation comprises the steps of: defining grid points inside and around a semiconductor device; generating a plurality of grids; setting linear quasi-Fermi potentials of carrier inside the grids; obtaining carrier concentration in the grids from the quasi-Fermi potentials; and using the carrier concentration, solving Poisson's equation and carrier continuity equation under a predetermined boundary condition.

According to the fourth feature of the present invention, the semiconductor device having the desirable characteristics can be developed in a shorter period than that of the prior art. This is because the device simulation method of the present invention can accurately and rapidly simulate the device behavior to thereby evaluate the semiconductor device with a higher accuracy. That is, according to the fourth embodiment of the present invention, the speculation of the characteristics of the semiconductor device prior to the actual fabrication process can be more accurately and rapidly carried out compared with the prior art. Hence, the semiconductor device can be developed to product stage with smaller number of trials, largely improving the efficiency of the research and the development.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF THE DRAWINGS

FIG. 11 is a flowchart describing the manufacturing method for the semiconductor device of the present invention.

DETAILED DESCRIPTION OF THE INVENTION

Figure 1:
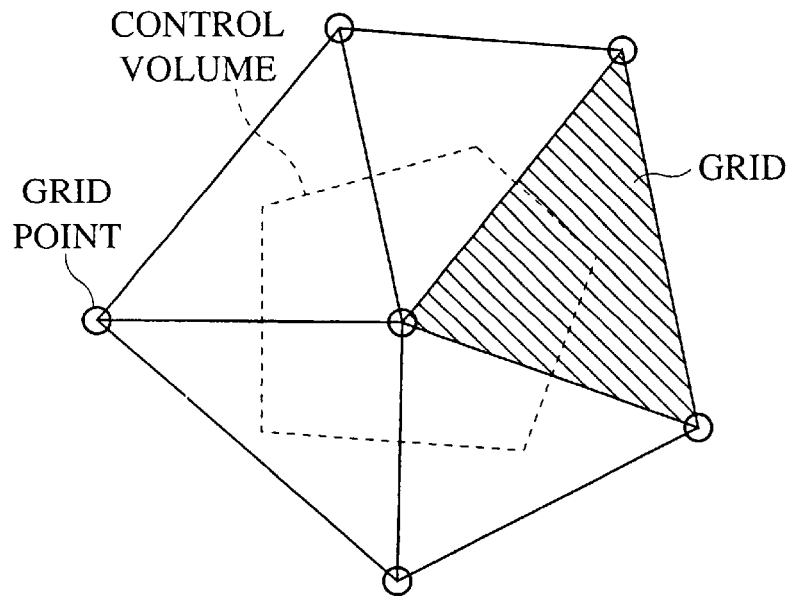
FIG. 1 is a view showing a relation between grid points, grids and the control volume.
Figure 2:
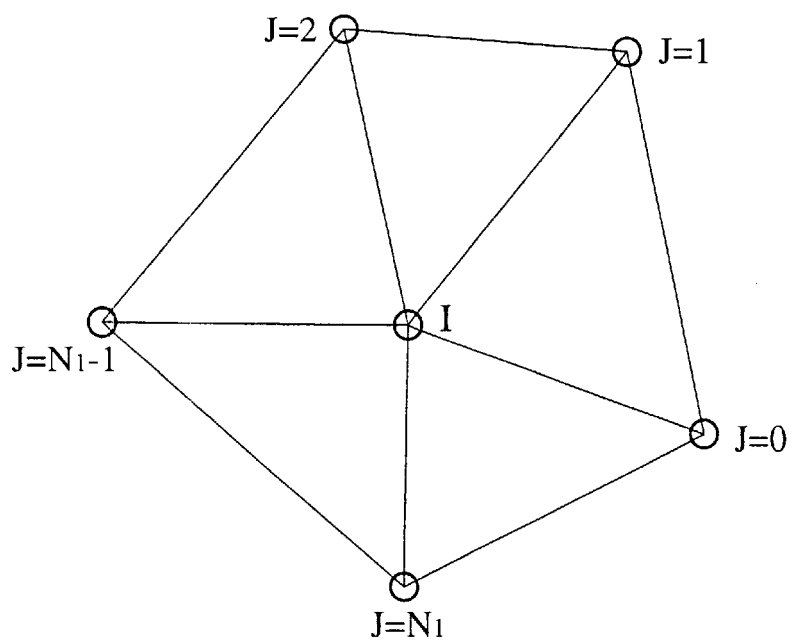
FIG. 2 is a view showing a layout of the grid points to explain a first prior art.
Figure 3:
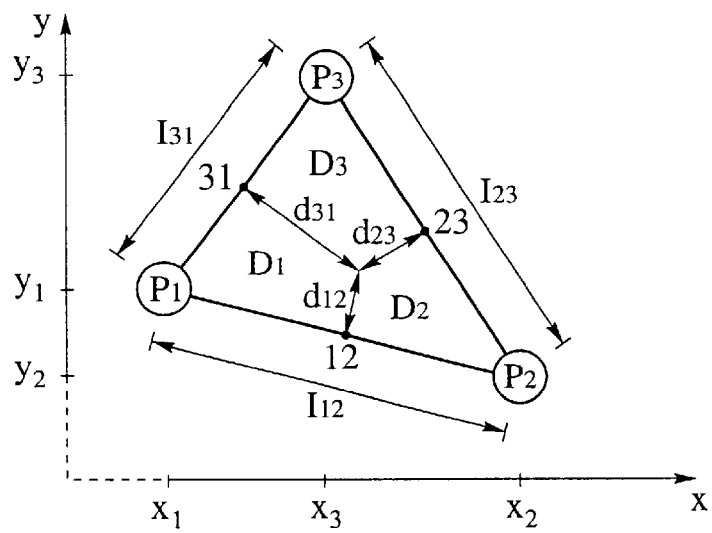
FIG. 3 is a view showing definitions of symbols to explain the first prior art.
Figure 4:
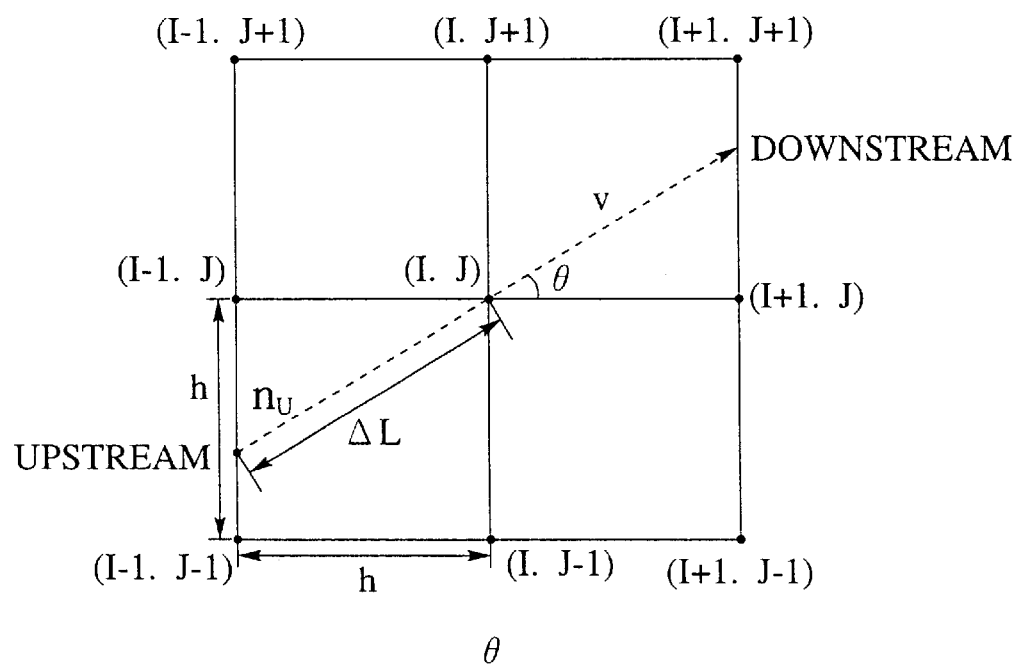
FIG. 4 is a view showing a second prior art, in which the oblique dotted line indicates a direction of the convection current vector, or "the streamline"
Figure 5:
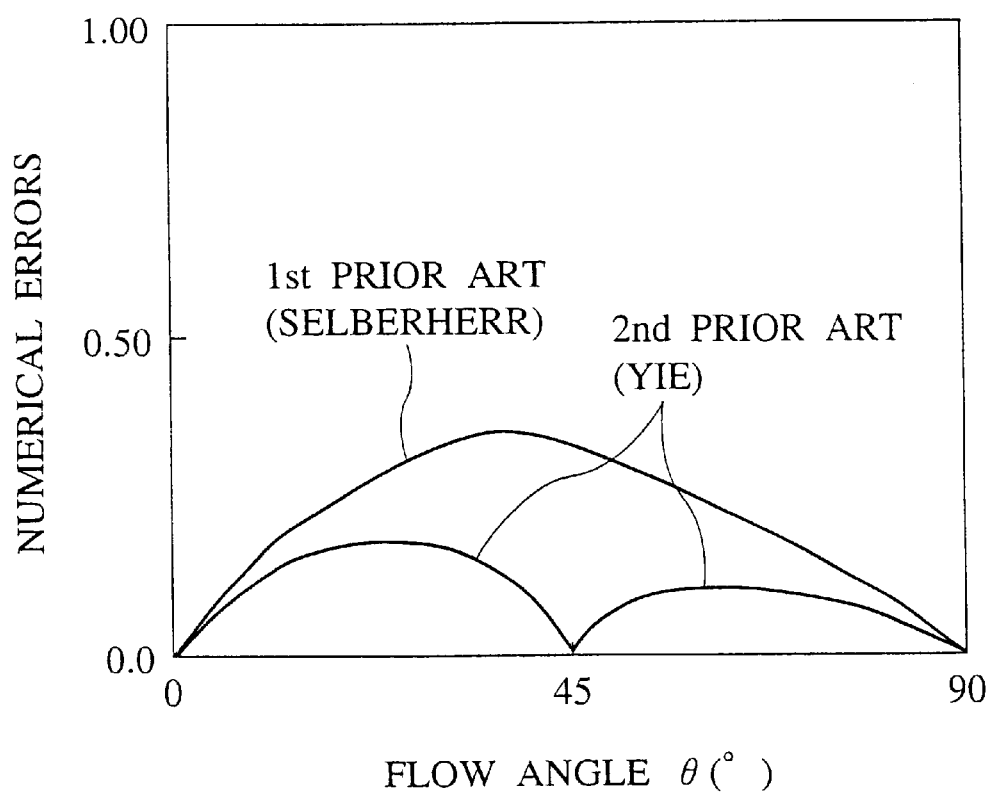
FIG. 5 is a view showing calculation errors in the first prior art and the second prior art, in which a horizontal axis indicates flow angle θ in FIG. 5.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally and as it is conventional in the representation of semiconductor devices, it will be appreciated that the layer thicknesses are arbitrarily drawn for facilitating the reading of the drawings. In other instances, well-known units or circuits have been shown in block diagram form in order not to obscure the present invention in unnecessary detail.

(First Embodiment)

A device simulator (device simulation apparatus) according to a first embodiment of the present invention has a function of simulating the behavior of the semiconductor device, after receiving the geometrical structure, the impurity profile and the like obtained by a process simulation, as well as the electric boundary conditions, such as terminal voltages, terminal currents and the like. Moreover, the device simulator according to the first embodiment of the present invention has a function of displaying the thus-obtained distributions of the potential, the electric field and the current within the semiconductor device, the carrier distributions of electrons and holes within it, the current-voltage characteristic thereof or the like, on an output unit.

Figure 6A:
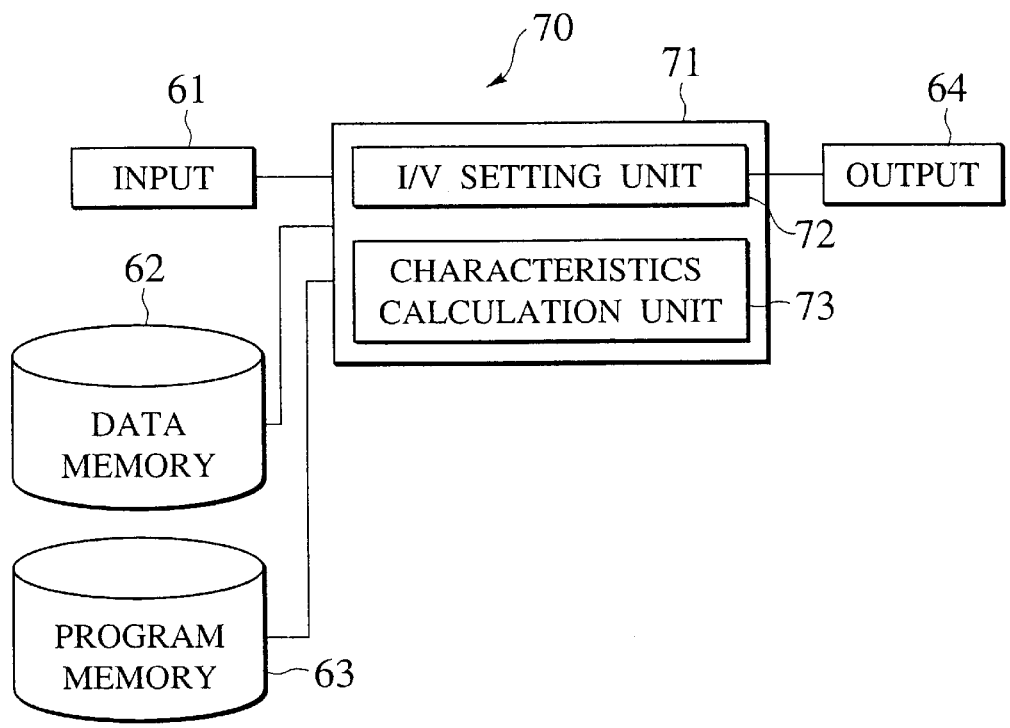
FIG. 6A is a block diagram of a simulator according to a first embodiment of the present invention.

That is, as shown in FIG. 6A, a device simulator 70 of the present invention at least contains: an input unit 61 for receiving an input, such as data, a command and the like, from an operator; a processor 71 for simulating the device behavior; an output unit 64 for outputting the simulation result; a data memory 62 for storing therein a predetermined data necessary for the analysis of the characteristics of the semiconductor device and the like; and a program memory 63 for storing therein a device simulation program and the like. The processor 71 at least contains a voltage/current setting unit 72 for setting the terminal voltages or the terminal currents conditions and a characteristics calculation unit 73. The voltage/current setting unit 72 and the characteristics calculation unit 73 may have the dedicated circuits respectively, or may comprise hardware for a general purpose computer system in which the respective functions of the units are given by a software program.

Figure 6B:
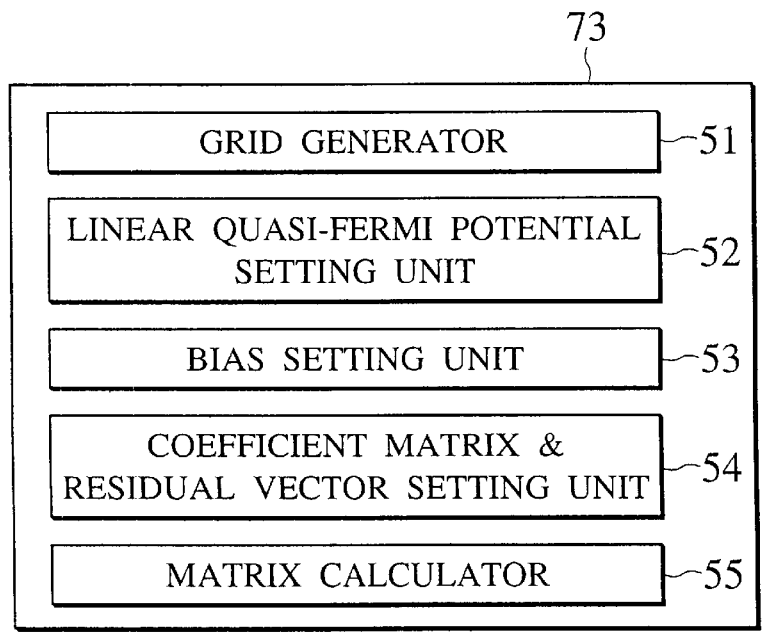
FIG. 6B is a block diagram of the simulator according to the first embodiment of the present invention.

The characteristics calculation unit 73 as shown in FIG. 6A can convert the Poisson's equation, the electron current continuity equation and the hole current continuity equation represented by Eqs. (1) to (3) into the simultaneous equations to thereby solve them and accordingly calculate the behaviors of electron, hole and the like in the semiconductor device. The semiconductor device may include a field effect transistor (FET), a bipolar transistor (BJT), a static induction transistor (SIT), a thyristor and the like. For this reason, as shown in FIG. 6B, the characteristics calculation unit 73 of the present invention at least contains a grid generator 51, a quasi-Fermi potential setting unit 52, a bias setting unit 53, a coefficient matrix and residual vector setting unit 54 and a matrix calculator 55. Here, the grid generator 51 defines a finite number of grid points inside and around a targeted semiconductor device, and generates a plurality of grids. The quasi-Fermi potential setting unit 52 sets a quasi-Fermi potential, which is linearly changing, at each section inside the grids generated by the grid generator 51. The bias setting unit 53 determines the biases applied to the predetermined electrode regions of the semiconductor device, such as the source electrode region, the drain electrode region, the gate electrode region and the like corresponding to the device behavior to be simulated. The coefficient matrix and residual vector setting unit 54 obtains the carrier concentration at any point inside each grid from the quasi-Fermi potential, and sets the coefficient matrix/residual vector for the basic equations (1) to (3). The matrix calculator 55 obtains the solutions in accordance with the known method.

In this way, with regard to each bias, the bias setting unit 53, the coefficient matrix and residual vector setting unit 54 and the matrix calculator 55 are used to solve the simultaneous equations converted from the Poisson's equation and the carrier continuity equations under the predetermined boundary condition to thereby obtain the device behavior. In FIG. 6A, the input unit 61 is composed of a keyboard, a mouse, a light pen or a floppy disk driver and the like. The processor 71, the data memory 62 and the program memory 63 are constituted by a usual computer system including a CPU and a memory, such as ROM, RAM and a magnetic disk and the like, connected to this CPU. The output unit 64 is composed of a display apparatus, a printer apparatus and the like.

The grid generator 51, the quasi-Fermi potential setting unit 52, the bias setting unit 53, the coefficient matrix and residual vector setting unit 54 and the matrix calculator 55 may have the dedicated circuits respectively, or may comprise a general purpose computer system in which the respective functions of the units are given by a software program. The program to attain the device simulation method of the present invention may be stored in the recording medium that can be read by the computer. This recording medium is read by the computer system, and the recorded program is stored in the program memory 63. Then, the processor 71 executes the sequence of operation steps instructed by this program. Accordingly, the device simulation method of the present invention can be attained. Here, the recording medium implies the storage medium, in which a program can be stored, such as a magnetic disk, an optical disk, a magneto-optical disk, a magnetic tape and the like.

Figure 7:
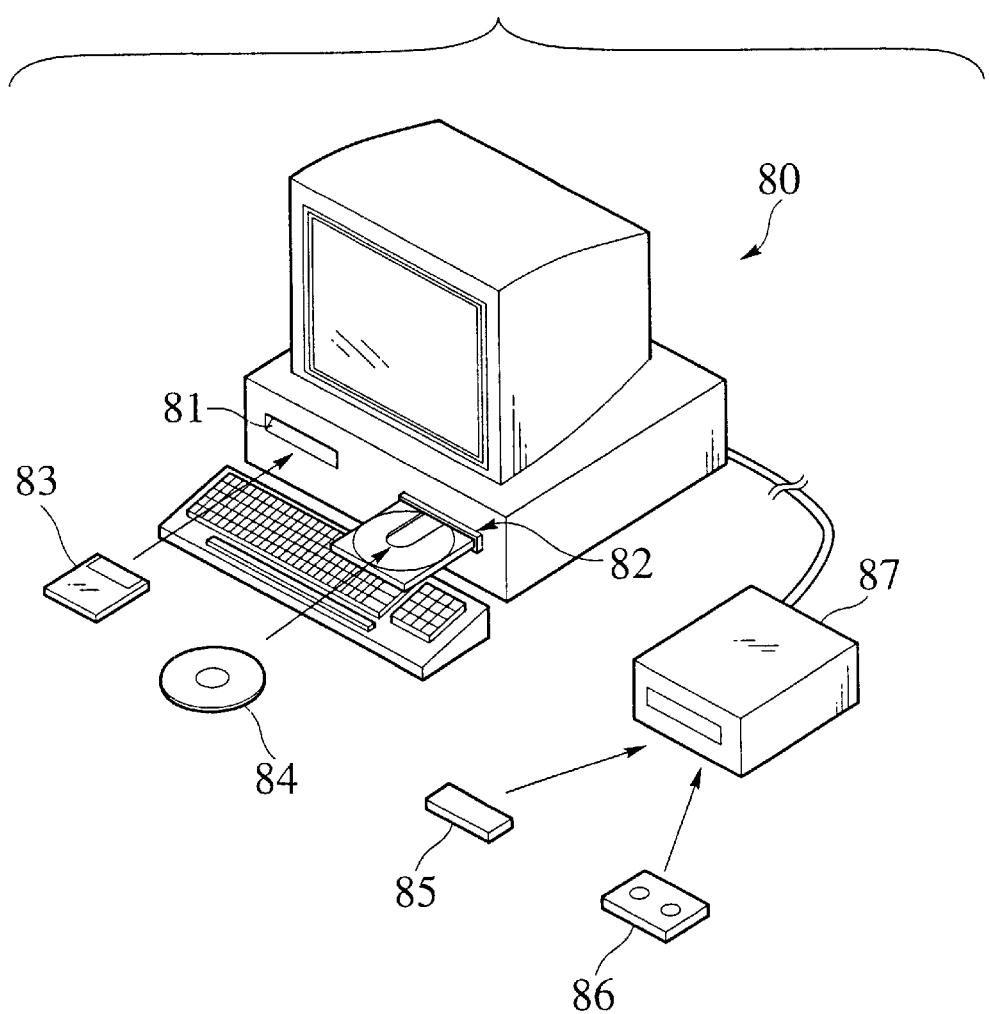
FIG. 7 is a bird's eye view of the simulator and the recording medium storing the program for the simulator according to the first embodiment of the present invention.

FIG. 7 is a bird's eye view showing the appearance of the device simulator of the present invention. The body of this device simulator 80 is provided with a floppy disk driver 81 and an optical disk driver 82. A floppy disk 83 storing the program for executing the device simulation method may be inserted into the floppy disk driver 81 from an insertion port thereof. Or a CD-ROM 84 storing the program may be inserted into the optical disk driver 82 from an insertion port thereof. Then, the programs stored in these recording media can be installed in the system by carrying out a predetermined reading operation. Furthermore, for example, a ROM 85 as the semiconductor memory, a cassette tape 86 as the magnetic tape can store the program to function the device simulator 80, by connecting the predetermined driver 87 for the ROM 85 or the cassette tape 86 to the device simulator 80.

Figure 8A:
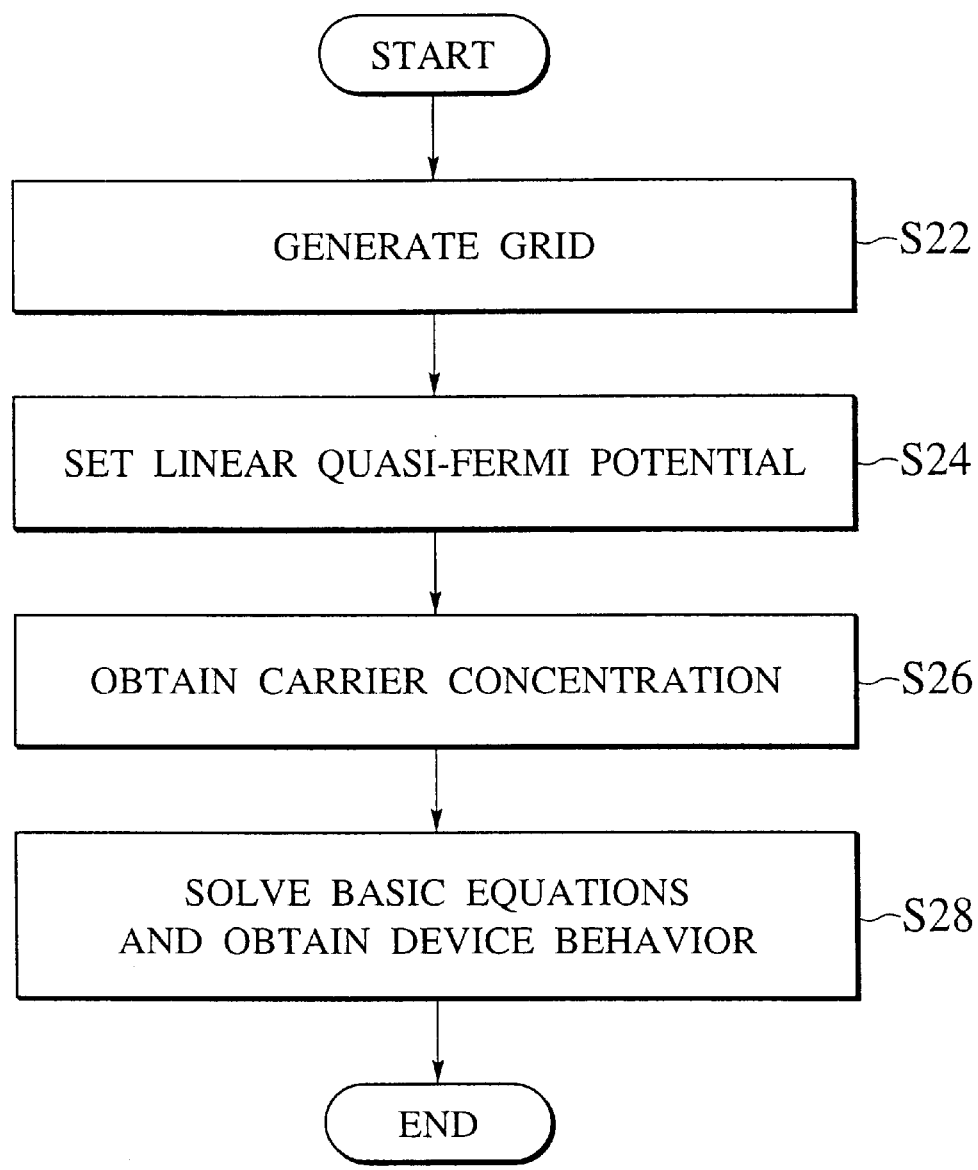
FIG. 8A is a flowchart schematically showing a simulation method according to the first embodiment of the present invention.

Next, the sequence of the operating process in the characteristics calculation unit 73 shown in FIG. 6A is explained with the aid of the flowchart shown in FIG. 8A:

(a) At first, at the step S22, the finite numbers of grid points are defined inside and around the semiconductor device and the plurality of grids are generated.

(b) At the step S24, the quasi-Fermi potentials of the carrier, which are linearly changing, are set at every sections inside the generated grids.

(c) At the step S26, the carrier concentrations at points inside each grid are obtained from this quasi-Fermi potential.

(d) And, at the step S28, by using this obtained carrier concentrations, the basic equations of the device simulation, composed of the Poisson's equation and the carrier continuity equations represented by Eqs. (1) to (3), are solved under the predetermined boundary conditions, and the device behavior is obtained.

The basic equations of the device simulation are the simultaneous partial differential equations composed of the Poisson's equation, the electron current continuity equation and the hole current continuity equation represented by Eqs. (1) to (3). Although these basic equations are the simultaneous partial differential equations, they must be converted into the simultaneous equations in order to solve by using the computer. This procedure is as follows.

The basic equations (1) to (3) are integrated in the control volume, respectively:

$$\int_{CV,i} \nabla \cdot D dv = q(P_i - N_i + N_{Di} - N_{Ai}) \qquad (25)$$

$$\partial(-qN_i)/\partial t + \int_{CV,i} \nabla \cdot J_e dv = -qU_i \qquad (26)$$

$$\partial(qP_i)/\partial t + \int_{CV,i} \nabla \cdot J_n dv = qU_i \qquad (27)$$

Here:

$$P_i = \int_{CV,i} p dv \qquad (28)$$

$$N_i = \int_{CV,i} n dv \qquad (29)$$

$P_i$ and $N_i$ are amounts in which the hole concentration p and the electron concentration n are respectively integrated with respect to the i-th control volume. Here, the hole concentration p and the electron concentration n are given by Eqs. (8) and (9).

In the first embodiment of the present invention, it is assumed that the potential $\psi$, the quasi-Fermi potential $\phi_p$ of hole and the quasi-Fermi potential $\phi_n$ of electron are linearly changing with respect to coordinates inside each grid. Also, the $\psi$ gives values at respective grid points belonging to a semiconductor region and an insulation film. Then, the quasi Fermi potential $\phi_p$ of hole and the quasi-Fermi potential $\phi_n$ of electron give values at each grid point belonging to the semiconductor region. Since each grid is triangular, on the basis of original values of $\psi$, $\phi_p$ and $\phi_n$ at each grid point, the new values at any point inside each grid can be obtained from linear interpolations of the values at the three vertexes. Thus the linear quasi-Fermi potentials of carriers are set inside the grids.

Furthermore, in a case of a three-dimensional space, the linear quasi-Fermi potential of carriers inside polyhedrons having four vertexes as the grid points are defined similar to the above-mentioned two-dimensional space. And the original values of $\psi$, $\phi_p$ and $\phi_n$ are given to each grid point at first, and the new values at any point inside each polyhedrons can be obtained from linear interpolations of the values at the four vertexes. Thus the linear quasi-Fermi potentials of carriers are set inside the polyhedrons.

Moreover, the integrations in Eqs. (28) and (29) are analytically executed. If it is assumed that the donor concentration $N_D$, the acceptor concentration $N_A$ and the carrier generation-recombination rate U are linearly or exponentially changing at each section inside the grid, they are respectively given by:

$$N_{Di} = \int_{CV,i} N_D dv \qquad (30)$$

$$N_{Ai} = \int_{CV,i} N_A dv \qquad (31)$$

$$U_i = \int_{CV,i} U dv \qquad (32)$$

By using a Gauss's theorem, Eqs. (25) to (27) can be converted as follows:

$$\int_{\Omega CV,i} D \cdot dS - q(P_i - N_i + N_{Di} - N_{Ai}) = 0 \qquad (33)$$

$$\partial(-qN_i)/\partial t + \int_{\Omega CV,i} J_e \cdot dS = -qU_i \qquad (34)$$

$$\partial(qP_i)/\partial t + \int_{\Omega CV,i} J_n \cdot dS = qU_i \qquad (35)$$

Figure 10:
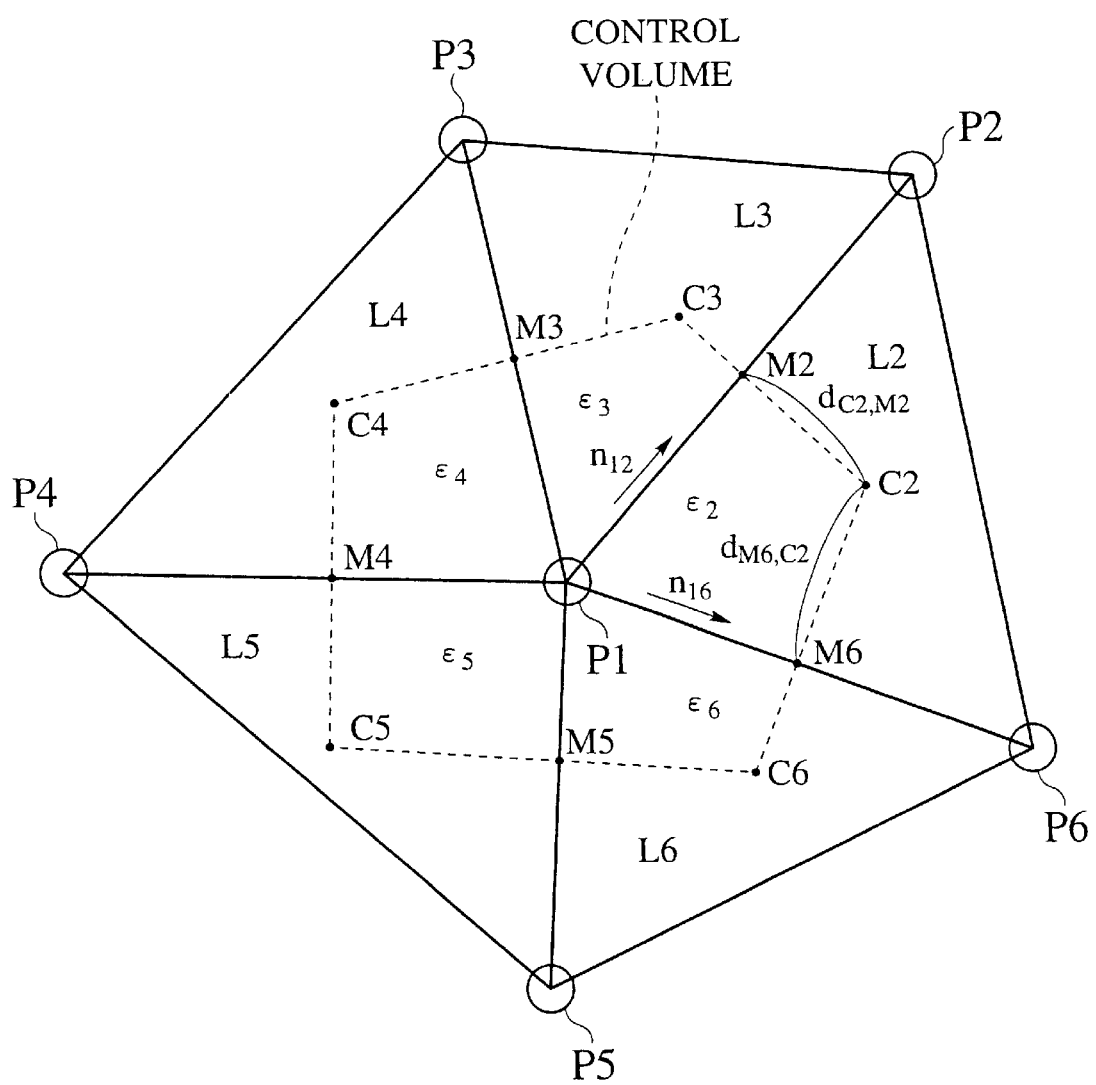
FIG. 10 is a view showing a relation between the grids, the grid points and the control volume used in the simulation method according to the first embodiment of the present invention.

With regard to the control volume shown in FIG. 10, the first term of the left side in Eq. (33) is given by the following equation:

$$\int_{\Omega CV,i} D \cdot dS = D_2 \cdot d_{6,2,2} + D_3 \cdot d_{2,3,3} + D_4 \cdot d_{3,4,4} + D_5 \cdot d_{4,5,5} + D_6 \cdot d_{5,6,6} \qquad (36)$$

Here, $D_i$ (i=2 to 6) is the electric displacement vector at a grid i (i=2 to 6). That, when it is assumed that the dielectric constant is $\in_i$ and the electric field vector at the grid i is $E_i$, Di is given by:

$$D_2 = \in_2 \cdot E_2 \qquad (37)$$

$$D_3 = \in_3 \cdot E_3 \qquad (38)$$

$$D_4 = \in_4 \cdot E_4 \qquad (39)$$

$$D_5 = \in_5 \cdot E_5 \qquad (40)$$

$$D_5 = \in_6 \cdot E_6 \qquad (41)$$

It is assumed that the potential $\psi$ is linearly changing with respect to the coordinates, inside each grid. Thus, the electric field is constant inside each grid.

$$E_i = -\nabla \psi_i \qquad (42)$$

For example, the electric field $E_2$ at the grid 2 can be obtained from the potential $\psi_2$ at the grid point 2, the potential $\psi_1$ at the grid point 1 and the potential $\psi_6$ at the grid point 6. $d_{6,2,2}$, $d_{2,2,3}$, $d_{3,4,4}$, $d_{4,5,5}$ and $d_{5,6,6}$ in Eq. (36) are given by the following equations (43) to (47). That is:

$$d_{6,2,2} = d_{M6,C2} n_{1,6} + d_{C2,M2} n_{1,2} \qquad (43)$$

$$d_{2,3,3} = d_{M2,C3} n_{1,2} + d_{C3,M3} n_{1,3} \qquad (44)$$

$$d_{3,4,4} = d_{M3,C4} n_{1,3} + d_{C4,M4} n_{1,4} \qquad (45)$$

$$d_{4,5,6} = d_{M4,C5} n_{1,4} + d_{C5,M5} n_{1,5} \qquad (46)$$

$$d_{5,6,6} = d_{M5,C6} n_{1,5} + d_{C6,M6} n_{1,6} \qquad (47)$$

Here, as shown in FIG. 10, $d_{Mk,Cl}$ (k=2 to 6, and l=2 to 6) is the length of a side (Mk,Cl) from a point Mk to a point Cl, and $n_{l,k}$ is the unit vector from a grid point l to a grid point k. In FIG. 10, five triangular grids L2, L3, L4, L5 and L6 are shown.

For example, in the triangular grid L2, $d_{M6,C2}$ is the length of a side (M6,C2) from a point M6 to a point C2 and $d_{C2,M2}$ is the length of a side (C2,M2) from a point C2 to point M2. And $n_{1,6}$ is the unit vector in a direction from a grid point P1 to a grid point P6 and $n_{1,2}$ is the unit vector in a direction from a grid point P1 to a grid point P2. If the first term in the left side of Eq. (33) is substituted by Eq. (36), Eq. (33) can be described by an algebraic equation of $\phi_p$ and $\phi_n$ at a grid point.

A method for converting the integral equation of Eq. (34) into the algebraic equation will be described below. With regard to the control volume shown in FIG. 10, the second term of the left side of Eq. (34) is given by the following equation:

$$\int_{\Omega CV,i} J_e \cdot dS = Q(v_{de2} \cdot N_{6,2,2} + v_{de3} \cdot N_{2,3,3} + v_{de4} \cdot N_{3,4,4} + v_{de5} \cdot N_{4,5,5} + v_{de6} \cdot N_{5,6,6}) \qquad (48)$$

Here, $v_{dem}$ (m=2 to 6) is the drift velocity vector of electron at a grid m. With $\phi_{n,m}$ as the quasi-Fermi potential of electron, the drift velocity vector $v_{dem}$ is given by the following equation:

$$v_{dem} = (-kT/q\tau_{pe})\Lambda_{em}(^{U\Phi}E_m/|^{\Phi}E_m|) + \xi_{em} \cdot v_{th} \qquad (49)$$

$$\Lambda_{em} = 1 - |E_m|/2|\sin h(\zeta_{m,\phi})/(\eta_\phi \cdot \sin h(\zeta_m)) \qquad (50)$$

$$\xi_{em} = (\cot h(\zeta_m) - 1/\zeta_m)(^{U}E_m - (^{U}E_m \cdot ^{U\Phi}E_m)) \qquad (51)$$

Here, $\tau_{pe}$ is the momentum relaxation time of electron. $\zeta_m$ is the potential at a grid m normalized by the thermal potential (kT/q), and $\zeta_{m,p}$ is the potential at the grid m normalized by the thermal potential, in which the quasi-Fermi potential $\phi_{n,m}$ of electron is considered. Then, they are respectively given by:

$$\zeta_m = -q|E_m||\lambda|/2kT \qquad (52)$$

$$\eta_\phi = |E_m/2 + \nabla \phi_{n,m}| \qquad (53)$$

$$\zeta_{m,\phi} = -q\eta_\phi|\lambda|/kT \qquad (54)$$

Moreover, $^{\Phi}E_m$ is the electric field vector at the grid m in which the quasi-Fermi potential is considered. Then, it is given by:

$$^{\Phi}E_m = E_m + \nabla \phi_{n,m} \qquad (55)$$

Also, $^{U\Phi}E_m$ is the unit electric field vector at the grid m in which the quasi-Fermi potential is considered, and $^{U}E_m$ is the unit electric field vector at the grid m. They are respectively given by:

$$^{U\Phi}E_m = (E_m + \nabla \phi_{n,m})/|E_m + \nabla \phi_{n,m}| \qquad (56)$$

$$^{U}E_m = E_m/|E_m| \qquad (57)$$

As mentioned above, $E_m$ is constant inside the grid m (m=2 to 6). Since the quasi-Fermi potential $\phi_{n,m}$ of electron is a linear function of the coordinates inside each grid, $\nabla \phi_{n,m}$ is also a constant vector inside the grid m. That is, $v_{dem}$ is a constant vector.

On the other hand, $N_{6,2,2}$, $N_{2,3,3}$, $N_{3,4,4}$, $N_{4,5,5}$ and $N_{5,6,6}$ in Eq. (48) are respectively given by the following equations (58) to (62):

$$N_{6,2,2}=N_{M6,C2}n_{1,6}+N_{C2,M2}n_{1,2} \tag{58}$$

$$N_{2,3,3}=N_{M2,C3}n_{1,2}+N_{C3,M3}n_{1,3} \tag{59}$$

$$N_{3,4,4}=N_{M3,C4}n_{1,3}+N_{C4,M4}n_{1,4} \tag{60}$$

$$N_{4,5,5}=N_{M4,C5}n_{1,4}+N_{C5,M5}n_{1,5} \tag{61}$$

$$N_{5,6,6}=N_{M5,C6}n_{1,5}+N_{C6,M6}n_{1,6} \tag{62}$$

Here, $N_{Mi,Cj}$ is a function in which the electron concentration n is line integrated with respect to the side (Mi,Cj) (i=2 to 6 and j=2 to 6) at the control volume shown in FIG. 10. Then, it is defined by the following equation (63):

$$N_{Mi,Cj} = \int_{M_i}^{C_j} n(x)dx \tag{63}$$

Eq. (63) can be analytically integrated since n is exponentially changing on the side (Mi,Cj).

Thus, Eq. (48) can be also represented by the algebraic equation of the quasi-Fermi potential $\phi_n$ of electron and the potential $\psi$ at the grid point. Hence, Eq. (34) can be also represented by the algebraic equation of the quasi-Fermi potential $\phi_n$ of electron, the quasi-Fermi potential $\phi_p$ of hole and the potential $\psi$ at the grid point.

Similarly to Eq. (34), Eq. (35) can be also represented by the algebraic equation of the quasi-Fermi potential $\phi_n$ of electron, the quasi-Fermi potential $\phi_p$ of hole and the potential $\psi$ at the grid point.

The basic equations of the device simulation to be solved in the first embodiment of the present invention are the simultaneous algebraic equations (33) to (35). Before solving the simultaneous algebraic equations (33) to (35), it is necessary to assume an approximate value of a solution at a predetermined bias to set as the initial value of the solution. The following three methods are used in the first embodiment of the present invention.

(a) A first method is a method for obtaining from a solution at a bias immediately before the predetermined bias and a solution of a bias one bias further earlier, by using a linear extrapolation. This method is used when assuming the initial value for the third bias and the bias after the third bias.

(b) A second method is a method for using the solution of the bias immediately before, as it is. This method is used when obtaining the initial value for the second bias.

(c) A final method is a method used when obtaining the initial value for the first bias. That is, this is a method for using a solution in the thermal equilibrium state.

Figure 8B:
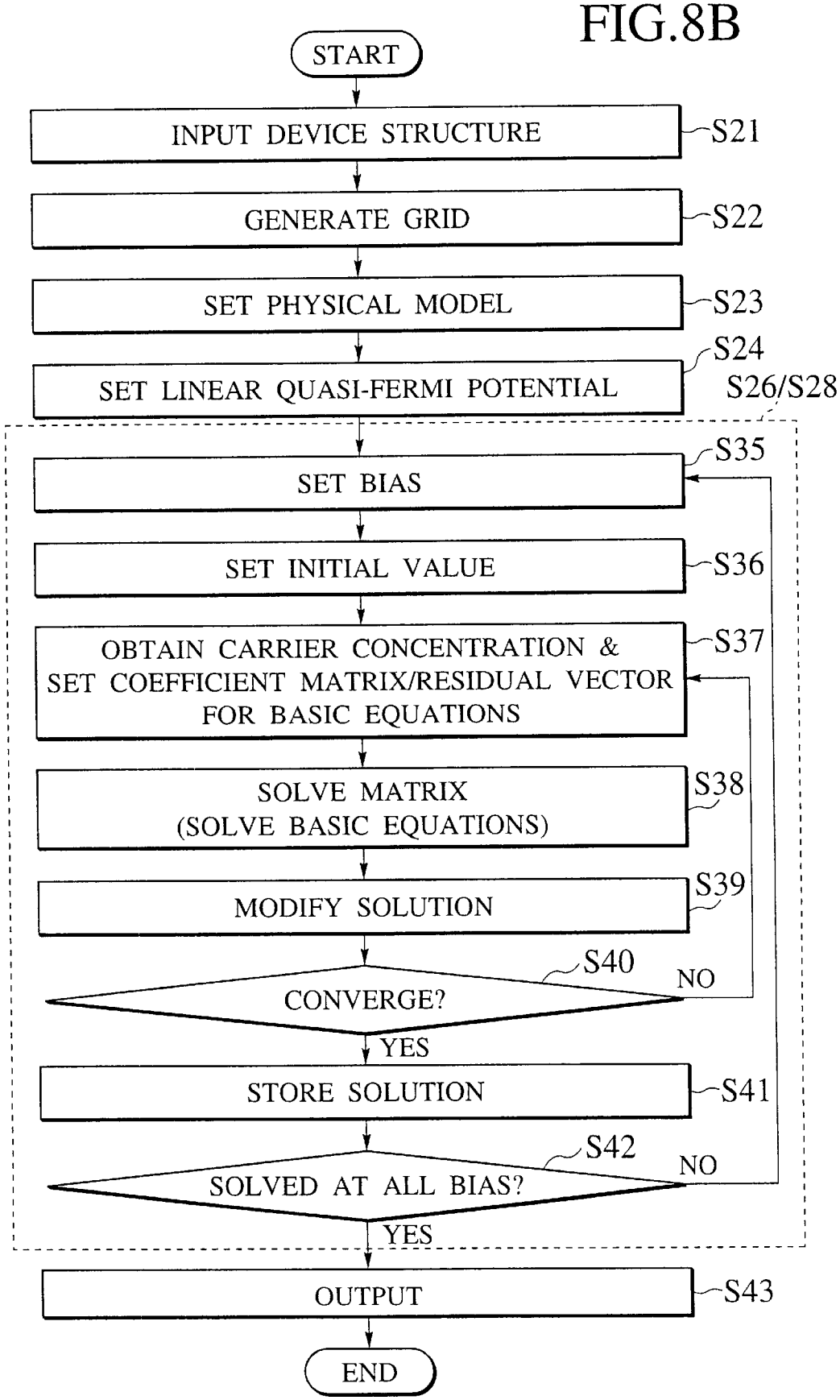
FIG. 8B is a detailed flowchart showing the simulation method according to the first embodiment of the present invention.

A flowchart shown in FIG. 8B is used to describe the procedure of a method which, while changing the bias voltage at a predetermined interval, carries out calculation of repetition loop from step S35 to S42, thereby executing the device simulation for all the biases.

(a) At a procedure of "START", start the device simulation. In the first embodiment of the present invention, start the software program stored in the program memory 63, such as a hard disk and the like.

Figure 9A:
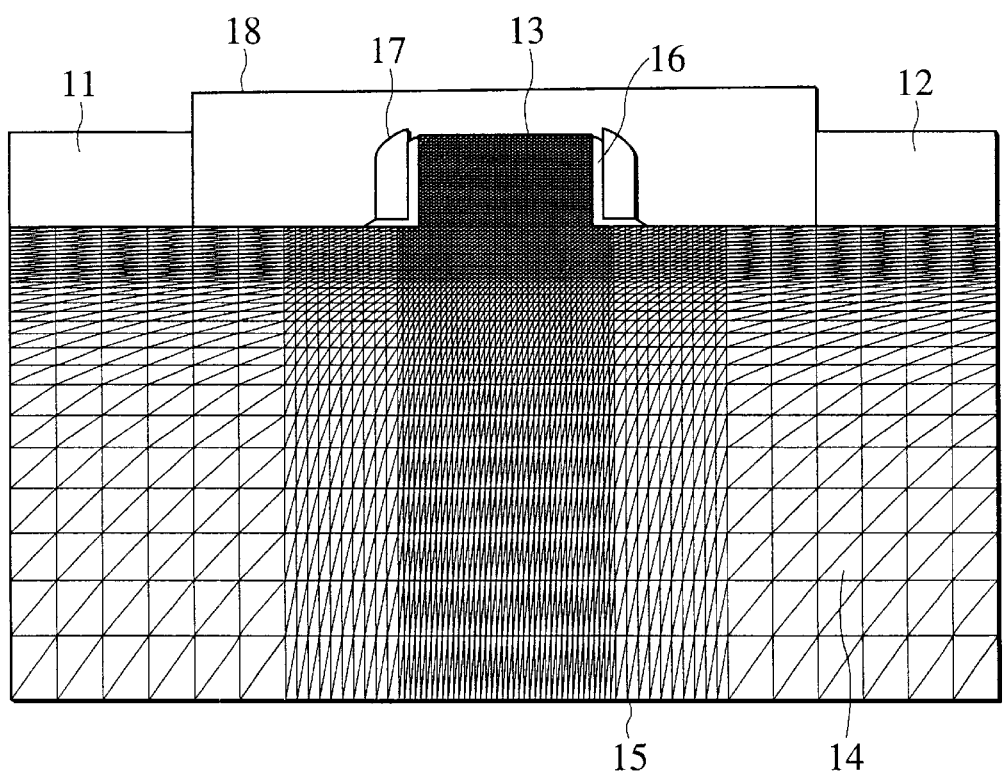
FIG. 9A is a view showing a device structure used in the simulation method according to the first embodiment of the present invention.

(b) At the step S21, input the geometrical structure of the targeted semiconductor device, the impurity profiles, names of respective electrode regions, the dielectric constants, the work functions and the like, to the input unit 61. In the first embodiment of the present invention, the geometrical structure, the impurity profile of the semiconductor device obtained by the known process simulator are used as the input data. FIG. 9A is a view showing a device structure (geometrical structure) inputted in the first embodiment of the present invention. This semiconductor device is MOSFET. A material of a substrate region 14 is silicon (Si). The geometry of the substrate region 14 is inputted to the input unit 61 of the device simulator by specifying the values of the coordinates of every grid points on the boundary line of the substrate region 14, along the counterclockwise direction. By the way, as for the other regions described below, the methods for inputting the geometries of the regions are identical to that of the substrate region 14. Since the dielectric constant of silicon is 11.7, this value is also inputted. Phosphorus (P), arsenic (As) and boron (B) are doped in the substrate region 14, as the impurities, to define the channel, source and drain regions. The impurity profile is inputted to the input unit 61 of the device simulator by inputting respective concentrations of the phosphorus, the arsenic and the boron, at grid points inside the substrate region 14 and on the boundary. Materials of a first insulation film (first gate sidewall film) 16, a second insulation film (second gate sidewall film) 17 and a third insulation film (interlayer insulation film) 18 are silicon oxide (SiO$_2$). Geometries of the first insulation film 16, the second insulation film 17 and the third insulation film 18 are also inputted by using the same method as the substrate region 14. Since the dielectric constant of the silicon oxide is 3.9, this value is also inputted. The semiconductor device in the first embodiment of the present invention has four electrode regions of a source electrode region 11, a drain electrode region 12, a gate electrode region 13 and a substrate electrode region 15, as shown in FIG. 9A. Using the same method as the substrate region 14 respectively inputs geometries of these electrode regions 11, 12, 13 and 15. Materials of the source electrode region 11, the drain electrode region 12 and the substrate electrode region 15 are aluminum (Al). Thus, 4.2 eV is inputted as the value of the work function for aluminum. A material of the gate electrode region 13 is poly-silicon. So, 11.7 is inputted as the value of the dielectric constant. Moreover, using the same method as the substrate region 14 inputs the impurity profile in the gate electrode region 13.

Figure 9B:
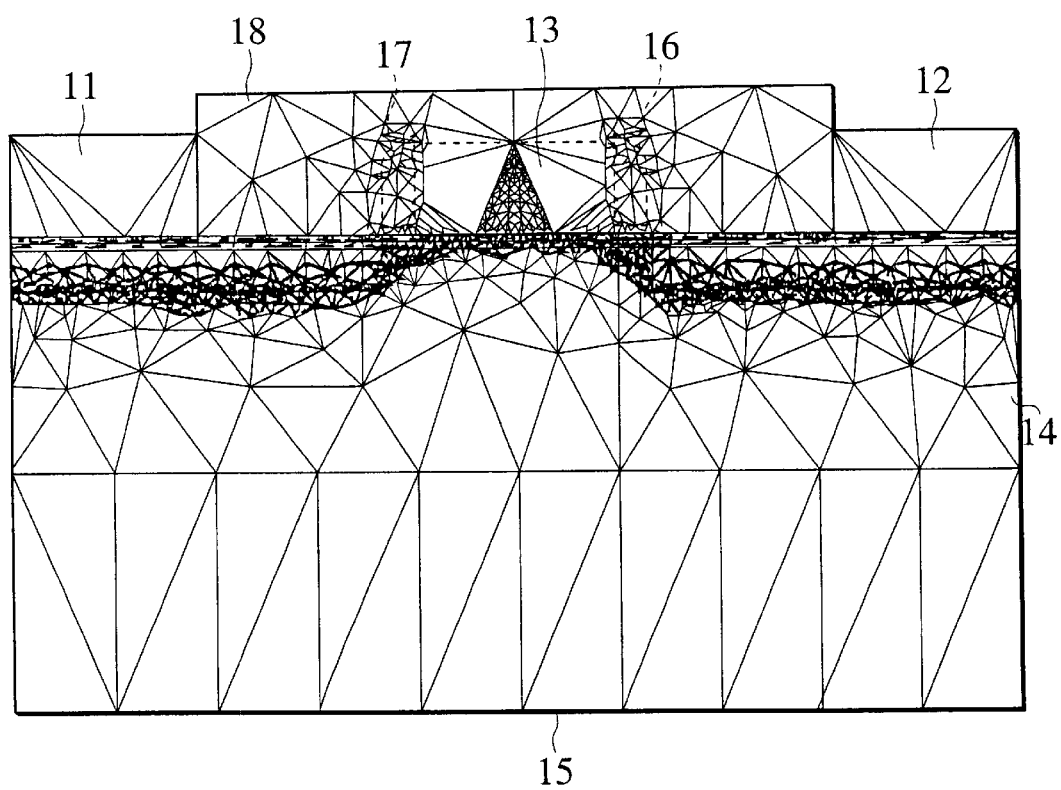
FIG. 9B is a view showing a triangular grid generated in the simulation method according to the first embodiment of the present invention.

(c) At the step S22, a known grid generation technique is used to generate triangular grids. FIG. 9B is a view showing the generated triangular grids. The triangular grids inside the substrate region 14 belong to the substrate region 14. Similarly, the triangular grids inside other regions 16, 17, 18 and 13 belong to the other regions 16, 17, 18 and 13, respectively. The grid points inside the substrate region 14 and on the boundary belong to the substrate region 14. The grid points inside the other regions 16, 17, 18 and 13 and on the boundary belong to the other regions 16, 17, 18 and 13, respectively. Dielectric constants of the respective regions 14, 16, 17, 18 and 13 are set for the triangular grids belonging to the substrate region 14, the first insulation film 16, the second insulation film 17, the third insulation film 18 and the gate electrode region 13. Work functions of the respective regions 11, 12 and 15 are set for the triangular grids belonging to the source electrode region 11, the drain electrode region 12 and the substrate electrode region 15. Also, impurity concentrations are set for the grids belonging to the substrate region 14 and the gate electrode region 13.

(d) At the step S23, set the predetermined "physical model". In the first embodiment of the present invention, for example, set the mobility model in order to calculate the mobility at the grid points belonging to the substrate region 14 and parameters thereof. For example, it is possible to set a known mobility model and the parameters thereof. Moreover, set carrier generation-recombination rate model in order to calculate carrier generation-recombination rate U at the grid points belonging to the substrate region 14 and parameters thereof. In the first embodiment of the present invention, set carrier generation-recombination rate U, which is changing linearly or exponentially, at each section inside the generated grids.

(e) At the step S24, set the quasi-Fermi potentials of carrier, which are linearly changing, inside the triangular grids generated at the step S22. That is, set the quasi-Fermi potential $\phi_e$ of electron and the quasi-Fermi potential $\phi_p$ of hole, inside each grid. Moreover, as for the donor concentration $N_D$ and the acceptor concentration $N_A$, set values which are linearly or exponentially changing, at each section inside the generated grids.

(f) At the step S35, input the biases applied to the four electrode regions of the source electrode region 11, the drain electrode region 12, the gate electrode region 13 and the substrate electrode region 15, in accordance with the device specification to be simulated. For example, if the current-voltage characteristic in the triode characteristic region (linear region) of MOSFET is simulated, for example, 0.1 V is applied to the drain electrode region 12. Then, a command of changing the gate electrode region 13 for each 0.1 V from 0 V up to, for example, 3 V is supplied to the device simulator. So, the device simulator firstly calculates a solution in a state that all the biases of the electrode regions 11, 12, 13 and 15 are 0 V, namely a solution in the thermal equilibrium state by using the following method. And then, the device simulator calculates next solution for the state that only the bias of the drain electrode region 12 is increased up to 0.1 V. Then, the device simulator sequentially calculates further next solution in a state that the gate bias is increased by 0.1 V so as to the gate bias becomes to be 0.1V. And then, the gate bias is further increased by 0.1 V so that the gate bias becomes to 0.2V to obtain still further next solution. Similarly, the gate bias is successively increased by 0.1 V to finally calculate the solution in a state that the gate bias is 3 V.

(g) A solution at a certain bias is calculated by using the loop procedures from "SET INITIAL VALUE" at the step S36 to "STORE SOLUTION" at the step S41. The execution of the sequence from the step S36 to S41 is equivalent to the sequence from the procedures for obtaining the carrier concentration at the step S26 in the flowchart of FIG. 8A to the step S28, solving the basic equations under the predetermined boundary condition. At this time, the basic equations (1) to (3) are converted into the simultaneous equations represented by Eqs. (33) to (35). Then, the simultaneous equations (33) to (35) are solved for all the control volumes. Actually, the known Newton's method is used to solve them in accordance with the procedures from the steps S36 to S41. At the step S36, it is necessary to assume an approximate value of a solution at a predetermined bias by using any method and then set as the initial value of the solution. The first embodiment of the present invention uses the above-mentioned three methods (a) to (c). At first, the potentials at the grid points belonging to the insulation films are set to 0 V. Next, the quasi-Fermi potentials are set to 0 V at the grid points belonging to the substrate region and the gate electrode region. The potential $\psi$ is determined and defined as the initial value so that in a case of a p-type semiconductor region, hole concentration p agrees with an impurity concentration and in a case of an n-type semiconductor region, electron concentration n agrees with an impurity concentration. At the step S37, carrier concentrations at any point inside each grid are obtained from the quasi-Fermi potential set at the step S24 to thereby set coefficient matrix/residual vector with respect to the basic equations. This setting of the coefficient matrix/residual vector uses the donor concentration $N_D$, the acceptor concentration $N_A$ and the carrier generation-recombination rate U which are set under the assumption that they are changing linearly or exponentially at the steps S23, 24. At the step S38, a modification value of the solution is calculated by using a known technique, on the basis of the coefficient matrix/residual vector set at the step S37. Moreover, at the step S39, adding the modification value calculated at the step S38 to the solution of the basic equations, by using a known technique, modifies the solution of the basic equations. After that, at the step S40, it is judged by using a known technique whether or not the solution of the basic equations is converged. If it is not converged, the flow returns back to the step S37, and the procedure of "OBTAIN CARRIER CONCENTRATION AND SET COEFFICIENT MATRIX/RESIDUAL VECTOR FOR BASIC EQUATIONS" is then carried out. If it is converged, the procedure of "STORE SOLUTION" at the step S41 is then carried out. At the step S41, the solution is stored to the data memory 62 as the solution at the predetermined bias.

(h) At the step S42, it is judged whether or not the calculations at all the biases are completed. If they are not completed, the flow returns back to the step S35, and the procedure of "SET BIAS" is carried out. Then, the procedures on and after the step S36 are repeated. If they are completed at the step S42, the procedure of "OUTPUT" at the step S43 is then carried out. At the step S43, the simulation results are provided on the output unit 64. For example, the terminal currents at each electrode regions at each bias, potentials at each grid points, carrier concentrations and the like are displayed or printed out. If the procedure of "OUTPUT" at the step S43 is completed, the necessary device behavior can be obtained to thereby end the simulation program according to the first embodiment of the present invention.

(Second Embodiment)

A second embodiment of the present invention includes the content common to that of the above-mentioned first embodiment. Thus, only the different points are described.

In the second embodiment, the second term of the left side of the above-mentioned (34) equation is calculated by the following equation:

$$\int_{\Omega_{CV,i}} J_e \cdot dS = F_{e2} \cdot N_{M6,C2,M21} + F_{e3} \cdot N_{M2,C3,M31} F_{e4} \cdot N_{M3,C4,M41} + F_{E5} \cdot N_{M4,C5,M51} + F_{e6} \cdot N_{M5,C6,M61} \qquad (64)$$

Here, by using $\Lambda_{em}$ defined by Eq. (50), it is represented by:

$$F_{e,m}=(-q/\tau_{pe})\Lambda_{em} \qquad (65)$$

$N_{Mj,Ck,Nk1}$ is the integration of electron concentration n in a quadrangle area defined by three vertexes (Mj,Ck,Mk1) and one vertex corresponding to a grid point. Then, it is defined by the following equation:

$$N_{Mj,Ck,Nk1}=\int_{Mj,Ck,Mk1} n dv \qquad (66)$$

A potential $\psi$ and the quasi-Fermi potential $\phi_n$ of electron are linear functions of positions at each grid. In addition, an integration area is polygonal. Thus, Eq. (66) can be analytically integrated.

Hence the right side of Eq. (48) can be described by the algebraic equation of the potential $\psi$ at the grid point, the quasi-Fermi potential $\phi_p$ of hole and the quasi-Fermi potential $\phi_n$ of electron. That is, the device simulation can be executed by using the same procedures as the first embodiment.

(Manufacturing Method for Semiconductor Device)

Next, according to the flowchart shown in FIG. 11, the flow of processes in the manufacturing method for the semiconductor device is explained. Namely, the respective processes in the flow of the manufacturing method is as follows:

(a) At first, at the step S301, the process simulation is executed prior to the device simulation. As the result, the distributions of impurities and defects in the semiconductor device, the geometrical structures and the like are obtained.

(b) When carrying out the device simulation at the step S302, the input data containing the electrical boundary conditions are given to the input unit 61 shown in FIG. 6A at first. Here, the electrical boundary conditions may contain the terminal voltages, the terminal currents and the like. Further the result of the impurity profile and the geometrical structures obtained by the process simulation are fed to the input unit 61, simultaneously with the electrical boundary conditions. Then, as described in the first and second embodiments, the device simulator defines the plurality of grid points inside and around the semiconductor device to be manufactured. And, the device simulator generates the plurality of grids, sets the quasi-Fermi potential of the carrier, which is linearly changing, at each section inside the grid, obtains the carrier concentration at any point inside each grid from the quasi-Fermi potential, uses the carrier concentration, solves the Poisson's equation and the carrier continuity equations under the predetermined condition, and then obtains the device behaviors of the semiconductor device. The device behaviors may include the current-voltage characteristics, the impedance characteristics, the S parameters, the high frequency characteristics and the like.

Moreover, as necessary, the device behaviors obtained as the result of the device simulation may constitute input data for the circuit simulation processed at the step S303 to obtain the circuit performances.

(c) At the step S304, it is evaluated and considered whether or not the device behaviors obtained by the device simulation at the step S302 or the circuit performance obtained by the circuit simulation at the step S303 agree with the desired electrical specifications of the semiconductor device.

(d) If it is judged by the evaluation at the step S304 that they agree with the desired electrical specifications of the semiconductor device, the actual fabrication process of the semiconductor device is started at the step S305. Foe example, impurity atoms are doped in the semiconductor materials by well known impurity doping processes, such as the thermal diffusion, the ion implantation process and the like. And, the geometry processings, such as the photolithography process, the dry/wet etching process and the like delineate a semiconductor substrate and the thin film stacked on a surface of the semiconductor substrate. Moreover, the film formation processes such as thermal oxidation, epitaxial growth, chemical vapor deposition (CVD), vacuum evaporation, sputtering and the like may be included in the actual fabrication process. Anyhow, the actual fabrication process including the predetermined sequence of these processes is executed to attain the targeted semiconductor device. On the contrary, if it is judged by the evaluation at the step S304 that they do not agree with the desired electrical specifications, the semiconductor device to be created can not be manufactured in the designed fabrication process. So, the condition of the fabrication process is changed, and the procedure itself, such as the order of the processes and the like are changed. Again, the flow returns back to the step S301 or the step S302. If it returns back to the step S301, the device simulation at the step S302 is further carried out with the result of the process simulation at the step S301 as the input data. Moreover, at the step S305, the actual behaviors of the semiconductor device obtained by the actual fabrication process are measured to test the fabrication result.

(e) At the step S306, it is evaluated whether or not the device behaviors tested at the step S305 satisfy the desired electrical specifications. If it is judged by this evaluation that the characteristics of the actually manufactured device do not satisfy the specifications, the design is modified at the step S307. The flow returns back to the step S301. Again, the process simulation is carried out. Then, the loop composed of a series of procedures of carrying out the device simulation at the step S302 is repeated with this result of the device simulation as the input data.

Briefness from the designing stage to the product stage is competed among manufacturing firms in the field of the semiconductor device, such as LSI and the like. The period for the simulation must be carried out as rapid as possible and as accurately as possible, if considering such reality of the racing among manufacturing firms in the semiconductor industry. According to the present invention, the loop period from the designing stage to the product stage can be made extremely short. And the complex and advanced semiconductor devices, requiring the simulation with the higher accuracy, are rapidly and efficiently manufactured with high yield.

Various modifications will become possible for those skilled in the art after receiving the teachings of the present disclosure without departing from scope thereof.

What is claimed is:

1. A computer implemented semiconductor device simulation method, configured such that a result of the simulation is used for manufacturing the semiconductor device, comprising the steps of:

(a) defining grid points inside and around a semiconductor device, and generating a plurality of grids, configured such that said grid points are disposed at respective vertexes of the grids;

(b) setting linearly changing quasi-Fermi potential profiles of carrier inside spaces defined by each of the grids;

(c) obtaining carrier concentrations from said linearly changing quasi-Fermi potential profiles in each of said spaces; and (d) solving basic equations comprising Poisson's equation and carrier continuity equation under a predetermined boundary condition, using said obtained carrier concentrations, wherein device behavior characteristics of the semiconductor device to be manufactured are obtained as a result of the computer implemented semiconductor device simulation method.

2. The method of claim 1, wherein said step of setting said linearly changing quasi-Fermi potential profiles comprises the steps of:

setting respective values of quasi-Fermi potentials to each of the grid points; and obtaining a new value of the quasi-Fermi potential at each point in the spaces defined by the grids, by interpolation of the set values at the grid points so as to define the linearly changing quasi-Fermi potential profiles.

3. The method of claim 1, wherein said carrier continuity equation is solved by using carrier current density J(r) at a position vector r, given by:

$$J(r)=(V_{dv}(r)+V_{dp}(r))QC(r)$$
$$V_{dv}(r)=(kT/Q\tau_p)\Lambda(r)^{U\Phi}E_r/|^{\Phi}E_r|$$
$$V_{dp}(r)=V_{th}\xi(r)(^{U}E_r\cdot^{U\Phi}E_r)^{U\Phi}E_r)$$

wherein Q is a charge of carrier, k is Boltzmann's constant, T is temperature, $\tau_p$ is carrier momentum relaxation time, $V_{th}$ is carrier thermal velocity, $E_r$ is electric field vector at the position vector r, $^{\Phi}E_r$ is electric field vector at the position vector r in which one of said linearly changing quasi-Fermi potential profiles is considered, $^{U}E_r$ is unit electric field vector at the position vector r, $^{U\Phi}E_r$ is unit electric field vector at the position vector r in which quasi-Fermi potential is considered, C(r) is carrier concentration at the position vector r, $\Lambda(r)$ and $\xi(r)$ are coefficients for drift velocity vectors in directions normal and parallel to a contour surface of the carrier profile, respectively.

4. The method of claim 1, wherein said carrier continuity equation is solved by using divergence $\nabla \cdot J(r)$ of carrier current density vector J(r) at a position vector r, given by:

$$\nabla \cdot J(r)=(Q/\tau_p)\Lambda(r)C(r),$$

wherein Q is charge of carrier, $\tau_p$ is carrier momentum relaxation time, C(r) is carrier concentration at the position vector r, and $\Lambda(r)$ is coefficient for drift velocity vector normal to a contour surface of the carrier profile.

5. A semiconductor device simulator having a processor, the processor comprising:

(a) a grid generator for defining grid points inside and around a semiconductor device and generating a plurality of grids, configured such that said grid points are disposed at respective vertexes of the grids;

(b) a quasi-Fermi potential setting unit for setting linearly changing quasi-Fermi potential profiles of carrier inside spaces defined by each of the grids;

(c) a bias setting unit for setting a bias applied to a predetermined electrode region of said semiconductor device;

(d) a coefficient matrix and residual vector setting unit for obtaining carrier concentrations from said linearly changing quasi-Fermi potential profiles in each of said spaces and setting a coefficient matrix/residual vector for basic equations; and (e) a matrix calculator for adding a modification value obtained by solving said coefficient matrix to a solution of said basic equations, modifying the solution, and repeating the calculation until the solution is converged, wherein device behavior characteristics of a semiconductor device to be manufactured are obtained as a result of an output of the semiconductor device simulator.

6. A computer readable medium storing a program being executed on a semiconductor device simulator, configured such that an output of the simulator is used for manufacturing the semiconductor device, the program comprising the steps of:

(a) defining grid points inside and around a semiconductor device, and generating a plurality of grids, configured such that said grid points are disposed at respective vertexes of the grids;

(b) setting linearly changing quasi-Fermi potential profiles of carrier inside spaces defined by each of the grids;

(c) obtaining carrier concentrations from said linearly changing quasi-Fermi potential profiles in each of said spaces; and (d) solving basic equations comprising Poisson's equation and carrier continuity equation under a predetermined boundary condition, using said obtained carrier concentrations.

7. The computer readable medium of claim 6, wherein said carrier continuity equation is solved by using carrier current density J(r) at a position vector r given by:

$$J(r)=(V_{dv}(r)+V_{dp}(r))QC(r)$$
$$V_{dv}(r)=(kT/Q\tau_p)\Lambda(r)^{U\Phi}E_r/|^{\Phi}E_r|$$
$$V_{dp}(r)=V_{th}\xi(r)(^{U}E_r\cdot^{U\Phi}E_r)$$

wherein Q is a charge of carrier, k is Boltzmann's constant, T is temperature, $\tau_p$ is carrier momentum relaxation time, $V_{th}$ is carrier thermal velocity, $E_r$ is electric field vector at the position vector r, $^{\Phi}E_r$ is electric field vector at the position vector r in which one of said linearly changing quasi-Fermi potential profiles is considered, $^{U}E_r$ is unit electric field vector at the position vector r, $^{U\Phi}E_r$ is unit electric field vector at the position vector r in which quasi-Fermi potential is considered, C(r) is carrier concentration at the position vector r, $\Lambda(r)$ and $\xi(r)$ are coefficients for drift velocity vectors in directions normal and parallel to a contour surface of the carrier profile, respectively.

8. The computer readable medium of claim 6, wherein said carrier continuity equation is solved by using divergence $\nabla \cdot J(r)$ of carrier current density vector J(r) at a position vector r, given by:

$$\nabla \cdot J(r)=(Q/\tau_p)\Lambda(r)C(r),$$

wherein Q is charge of carrier, $\tau_p$ is carrier momentum relaxation time, C(r) is carrier concentration at the position vector r, and $\Lambda(r)$ is coefficient for drift velocity vector normal to a contour surface of the carrier profile.

9. A method for manufacturing a semiconductor device comprising the steps of:

(a) obtaining device behavior by simulation comprising the steps of:
- defining grid points inside and around a semiconductor device;
- generating a plurality of grids, configured such that said grid points are disposed at respective vertexes of the grid;
- setting linearly changing quasi-Fermi potential profiles of carrier inside spaces defined by each of the grids;
- obtaining carrier concentration in each of said spaces defined by the grids from said linearly changing quasi-Fermi potential profiles; and
- using the carrier concentration, solving Poisson's equation and carrier continuity equation under a predetermined boundary condition;

(b) judging whether or not the device behavior agree with the desired electrical specification; and (c) if it is judged the device behavior agree with the desired electrical specification, performing a series of fabrication processes including impurity doping and geometry processing to attain the semiconductor device, wherein device behavior characteristics of the semiconductor device to be manufactured are obtained as a result of performing the method for manufacturing a semiconductor device.

10. The method of claim 9, wherein said carrier continuity equation is solved by using carrier current density $J(r)$ at a position vector r given by:

$$J(r)=(V_{dv}(r)+V_{dp}(r))QC(r)$$

$$V_{dv}(r)=(kT/Q\tau_p)\Lambda(r)^{U\Phi}E_r/|^\Phi E_r|$$

$$V_{dp}(r)=V_{th}\xi(r)(^U E_r - (^U E_r \cdot ^{U\Phi}E_r)^{U\Phi}E_r)$$

wherein Q is a charge of carrier, k is Boltzmann's constant, T is temperature, $\tau_p$ is carrier momentum relaxation time, $V_{th}$ is carrier thermal velocity, $E_r$ is electric field vector at the position vector r, $^\Phi E_r$ is electric field vector at the position vector r in which one of said linearly changing quasi-Fermi potential profiles is considered, $^U E_r$ is unit electric field vector at the position vector r, $^{U\Phi}E_r$ is unit electric field vector at the position vector r in which quasi-Fermi potential is considered, $C(r)$ is carrier concentration at the position vector r, $\Lambda(r)$ and $\xi(r)$ are coefficients for drift velocity vectors in directions normal and parallel to a contour surface of the carrier profile, respectively.

11. The method of claim 9, wherein said carrier continuity equation is solved by using divergence $\nabla \cdot J(r)$ of carrier current density vector $J(r)$ at a position vector r, given by:

$$\nabla \cdot J(r)=(Q/\tau_p)\Lambda(r)C(r),$$

wherein Q is charge of carrier, $\tau_p$ is carrier momentum relaxation time, $C(r)$ is carrier concentration at the position vector r, and $\Lambda(r)$ is coefficient for drift velocity vector normal to a contour surface of the carrier profile.

* * * * *